United States Patent
Hertz et al.

(10) Patent No.: US 7,293,567 B2
(45) Date of Patent: *Nov. 13, 2007

(54) APPLICATION OF ACOUSTIC AND VIBRATIONAL ENERGY FOR FABRICATING BUMPED IC DIE AND ASSEMBLY OF PCA'S

(76) Inventors: Allen David Hertz, 12784 Tulipwood Cir., Boca Raton, FL (US) 33428; Eric Lee Hertz, 125 Freddie St., Indian Harbour Beach, FL (US) 32937; Dennis D. Epp, 24 Grandbriar, Aliso Viejo, CA (US) 92656

( * ) Notice: Subject to any disclaimer, the term of this patent is extended or adjusted under 35 U.S.C. 154(b) by 311 days.

This patent is subject to a terminal disclaimer.

(21) Appl. No.: 10/737,240

(22) Filed: Dec. 16, 2003

(65) Prior Publication Data

US 2004/0124230 A1    Jul. 1, 2004

(51) Int. Cl.
*B08B 3/10* (2006.01)
(52) U.S. Cl. ............. 134/1.3; 134/25.4; 228/201
(58) Field of Classification Search .......... 228/201, 228/33, 39, 199; 101/123, 129; 134/1, 1.3, 134/6, 16, 25.4
See application file for complete search history.

(56) References Cited

U.S. PATENT DOCUMENTS

| 5,205,896 A * | 4/1993 | Brown et al. ............... 156/297 |
| 5,407,488 A * | 4/1995 | Ray .............................. 134/6 |
| 5,839,191 A * | 11/1998 | Economy et al. .............. 29/843 |
| 5,860,361 A * | 1/1999 | Nanjyo et al. .............. 101/424 |
| 5,976,269 A * | 11/1999 | Hamasaki et al. ............ 134/21 |
| 5,988,060 A * | 11/1999 | Asai et al. ................... 101/123 |
| 6,119,367 A * | 9/2000 | Kamikawa et al. ........... 34/401 |
| 6,138,562 A * | 10/2000 | Hertz et al. ................. 101/129 |
| 6,178,974 B1 * | 1/2001 | Kobayashi et al. .......... 134/1.3 |
| 6,260,562 B1 * | 7/2001 | Morinishi et al. ......... 134/57 R |
| 6,412,685 B2 * | 7/2002 | Hertz et al. ................. 228/246 |
| 6,471,111 B1 * | 10/2002 | Hertz et al. .............. 228/111.5 |
| 6,662,812 B1 * | 12/2003 | Hertz et al. .................. 134/1.3 |

FOREIGN PATENT DOCUMENTS

JP    10156298 A * 6/1998

* cited by examiner

*Primary Examiner*—Len Tran
(74) *Attorney, Agent, or Firm*—Allen D. Hertz

(57) ABSTRACT

A method and apparatus are disclosed for improving a screen printing process by applying vibrational energy to assist in the print release, cleaning, and drying processes. The vibrational energy or acoustic pressure waves may be created by a transducer where the waves are transferred to the stencil or printable material through air or a vibrational interface medium. The vibrational energy in turn assists with separating the printable material from the side walls of the apertures of the stencil. The vibrational energy can further assist in the process of cleaning the stencil. The acoustic pressure can also be used in the drying process by having the waves impinge on the water droplets to atomize the droplets on the surface of the stencil. The technology can be used for the assembly of Printed Circuit Assemblies, Ball Grid Array IC Packages, Flip Chip, etc. The same technology may be applied to other cleaning processes for cleaning Printed Circuit Assemblies, tooling, and the like, whereby the cleaning processes can assist in cleaning within the cracks, crevices and hard to reach areas of connectors and other components, without undesirable heat.

20 Claims, 21 Drawing Sheets

APPLICATION OF ACOUSTIC AND VIBRATIONAL ENERGY FOR FABRICATING BUMPED IC DIE AND ASSEMBLY OF PCA'S

RELATED US APPLICATION DATA

This patent application claims priority to Utility application Ser. No. 09/621,249, filed Jul. 21, 2000 (Issuing as U.S. Pat. No. 6,662,812) which claims priority to Provisional Patent Application 60/145,524 filed Jul. 24, 1999.

This patent application further claims priority to Utility patent application Ser. No. 09/208,959, filed on Dec. 10, 1998 (Issued as U.S. Pat. No. 6,138,562) which claims priority to U.S. Provisional Application No. 60/071,866, filed Jan. 20, 1998

This patent application further claims priority to Utility patent application Ser. No. 09/309,697 filed on May 11, 1999, (issued as U.S. Pat. No. 6,412,685) which is a continuation-in-part of Ser. No. 08/789,883 filed 1997, Jan. 28 (issued as U.S. Pat. No. 6,202,918).

All of the above are incorporated by reference.

FIELD OF THE INVENTION

This invention relates in general to the field of screen printing, and in particular to a method and apparatus for acoustic and vibrational energy assisted printing and release of solder paste and cleaning and drying of the respective solder stencil.

BACKGROUND OF THE INVENTION

Respective to the Print Release portion of the present invention:

The present invention can be applied to many applications, two of which are the application of Solder bumps to Integrated Circuit (IC) Wafers or die and the application of solder paste onto Printed Circuit Boards for populating Printed Circuit Assemblies.

The current process for applying solder bumps to IC wafers or die is extremely inefficient resulting in high assembly costs. The current process involves applying a solder mask to the wafer, plating solder to the wafer, reflowing the plated solder, then removing the solder mask.

As technology advances, components are getting smaller, the size of the solder connections are respectively being reduced, and therefore, the assembly process of Printed Circuit Cards is requiring the application of smaller and smaller deposits of solder paste.

What is desired, as an overview, is a low cost and repeatable process for applying solder bumps directly to an IC as a means to reduce the assembly costs.

What is further desired would be the application of similar technology for the use in populating high tech, fine pitch printed circuit assemblies (PCA's).

A stencil (also referred to as a screen) is created with an aperture or a plurality of apertures defining a pattern that is to be 'printed' onto a surface. The stencil is placed onto a surface upon which a material is to be deposited in a pattern. The material may be in a liquid, a solid or a solid/liquid composition. In the case of the preferred embodiment, the material that is to be deposited comprises fine particles of solder powder mixed into flux, commonly referred to as solder paste.

The stencil is generally placed substantially parallel to the surface, and may contact the surface, with the stencil and the aperture(s) aligned to a pattern on the surface to be printed to apply the desired pattern of material. For gravity-driven printing, the stencil is generally placed on top of the surface. The material to be deposited is then placed on top of the stencil for deposition into the aperture(s). Various methods may be used to move the material across the non-contact side of the stencil, placing the material into the aperture(s), as generally known in the art. For example, squeegees are often used in various ways to move material into the aperture or apertures. Once the apertures are filled with material, excess material may be removed from the non-contact side of the stencil so that substantially all of the material that remains is within the aperture(s).

Lastly, the stencil and the surface to be printed upon are separated, transferring the material in the desired pattern onto the surface of the object.

Various methods and equipment have been invented to automate the process described above, with many different approaches, as are known in the art. Many improvements in the art have resulted in an increase in the efficiency of the process. For example, machines have been invented to hold the stencil, align the stencil to the surface to be printed upon, deposit material into the apertures while removing any excess material, and finally separate the stencil and the surface being printed upon. However, none of these has solved the problems that the present invention solves to ensure a repeatable amount of material is transferred to the surface being printed upon.

The screen printing process is made more difficult as the size of the apertures decreases and the size of the surface area on the objects decreases. This is particularly true in manufacturing printed circuit assemblies and applying solder bumps to IC wafers or die. One particular problem that the present invention solves is that the material to be deposited onto the surface tends to stick to the sides of the apertures in the stencil. This problem has several particular outcomes that the present invention solves. First, the deposited material may slump or otherwise move outside the area defined by the aperture after the stencil is removed. For electronic assemblies, this can have disastrous consequences and require rework of defects. Secondly, the shape of the remaining material may cause problems. Preferably, the material that is left on the surface will have a uniform surface defined by the outside of the stencil, and the remaining top surface of the material will be substantially flat. Third, it is desired that the maximum amount of material be transferred of the material placed into the apertures to the object. For PCBs, the surface on which the material is to be deposited may generally be referred to as a pad. Uniformity is very important for pads so as not to create an area of conductivity where that is not desired. Further, it is important that the pad have a uniform top surface to enhance the attachment of electronic components. Forth, the apertures must remain void of any excess material to ensure repeatable transfer of material is accomplished.

FIGS. 1A, 1B, 1C and 2 are simple illustrations that show some of the basic steps in the process. The geometrical problem from a FIG. 1A shows a three-dimensional view of a stencil. FIGS. 1B, 1C, 1D and 2 show two-dimensional views. FIG. 1A shows a section of a stencil 20 that has aperture(s) 22 registered to pad(s) 14 on a Printed Circuit Board 10. FIG. 1A further illustrates the material deposition surface 12 of the Printed Circuit Board 10 as well as some circuitry 16. FIG. 1B shows a single aperture 22 in the section of the stencil 20 from a cross sectional view, during a registration step, registered, but some distance to the material deposition surface 12. The aperture(s) 22 comprises an aperture side-wall 24. FIG. 1C shows the same section of the stencil 20 placed against the material deposition surface 12 and a material 26 has been placed in the aperture(s) 22. Finally, FIG. 1D shows the stencil 20 that has been lifted off the surface 12, leaving behind the material 26. The surface area of the aperture side-wall 24 of the aperture(s) 22 in each of FIGS. 1A, 1B, 1C and 1D are relatively small compared to the target area 18 of the material deposition surface 12 defined by the aperture(s) 22. When the stencil 20 is removed after material 26 is placed in the apertures, gravity and surface effects cause most of the material 26 to stick to the target area 18. To a lesser extent, surface effects cause the material 26 to stick to the aperture side-wall 24. If the target area 18 is much larger than the sides of the aperture(s) 22, the effect of material sticking to the aperture side-wall 24 is of less practical concern.

However, FIG. 2 illustrates the problem presented when one uses a thicker stencil 30—the surface area of a taller aperture side-wall 32 of the aperture(s) 22 become relatively larger when compared to the target area 18 of the material deposition surface 12. This is generally due to shrinkage in the size of the components to be mounted or the density of the leads of the components. Here, the surface tension effects of the material 26 contacting the taller aperture side-wall 32 are relatively larger, resulting in a tendency for the material 26 to stick to the taller aperture side-wall 32 of the aperture(s) 22, causing a number of problems or potential problems. As mentioned earlier, the material may slump and migrate outside the area defined by the aperture causing conductivity problems. Further, the surface area of the resulting deposit may not be uniform (illustrated later), potentially creating problems in attaching components. And lastly, the maximum transfer of the material from the aperture(s) 22 to the material deposition surface 12.

The limitations of this process continue to be challenged as the aperture(s) 22 and the resulting target area 18 (generally an area respective to the pad(s) 14) decrease in size. There are factors other than geometry that may impact the release of the material. Examples include the shear to tact ratio of the material, the surface finish of the stencil, cleanliness of the stencil, and the cross sectional geometry of the stencil aperture.

To date, attempts to solve the problem have focused on changing the stencil release speed, changing the surface finish of the stencil, and changing the cross-sectional geometry of the aperture(s) 22 using a aperture side-wall 24 that is non-vertical.

A first known method is the use of a slow separation between the thicker stencil 30 and the material deposition surface 12. The slow separation utilizes gravity to assist in the release of the material 26 by allowing the weight of the material 26 to overcome the shear force (illustrated in a later figure) at the interface between the material 26 and the taller aperture side-wall 32 of the aperture(s) 22 of the thicker stencil 30. The detriment of this approach is that it inherently increases the cycle time of the process.

A second method known to assist with release of the material 26 is to modify the surface of the aperture side-wall 24, 32 of the stencil 20, 30. Two examples of this applied to metal stencils would be electropolishing and nickel-plating the surface after creating the aperture(s) 22.

A third known method to assist with release of the material 26 is to design the cross section of the aperture(s) 22 in a trapezoidal shape, where the area defined by the aperture(s) 22 at the PCB contact side of the stencil is larger than the area defined by the aperture(s) 22 at the solder side of the stencil.

Thus, what is desirable, is a means to increase the speed of release of the material 26 without altering the geometry of the deposition, ensuring maximum transfer of the material 26 from the aperture(s) 22 to the object, and increasing the quality of the resulting material 26 deposition.

Respective to the Cleaning Portion of the Present Invention:

Fluid based cleaning systems are commonly used for cleaning Printed Circuit assemblies (PCA's), Wafers, and PCA Assembly Tooling. Hot air drying systems are an established method of drying bare Printed Circuit Assembly (PCA's), various components on a (PCA), and tooling which may require cleaning such as stencils, board supports, and the like. There are a wide variety of equipment and processes available to manufacture, solder, clean and dry PCA's, however, the general principles of the process remain the same, as explained below.

Components may be surface mounted to the PCA utilizing solder paste which may contain flux used to deoxidize the surface mount pads on the PCA and the leads of the components. The powder of solder is fused during a reflow process, creating the electro-mechanical connections. During this process, the flux is activated, where some of the ingredients of the flux evaporate, leaving a residue on the assembly, referred to as a module. Components may additionally be assembled to the PCB using a wave solder process, where leaded component are assembled by placing the leads into non-plated and/or plated through holes and/or surface mount components are glued to a bottom surface of the PCA. This assembly is then wave soldered to the PCA utilizing flux to deoxidize the leads and plated through holes. Flux residue and other contaminants may remain on the module. The module may then be cleaned in an aqueous cleaning system. Cleaning may be used to remove flux residue or other contaminates such as solder balls associated with the component or module manufacturing process. Once cleaned, it is important to remove all of the moisture from the interior of open components and the exterior of the module.

The limitations of this process continue to be challenged with the inclusion of smaller openings within connectors, smaller gaps under components, and the like which can entrap moisture. Any excess water or moisture will cause corrosion over time. This is especially a problem when power is applied to a module which is not dry, causing a galvanic reaction and, therefore, corrosion.

Tooling, such as solder stencils and wave solder pallets, require cleaning as become contaminated with either solder paste or flux residue. Solder stencils need to have any remaining solder paste removed prior to storage. If the solder paste dries within the apertures of the stencil, the dried solder paste will interfere with the release of the solder paste during the next assembly process and cause defects. Solder stencils are not currently used for applying solder paste or solder spheres to IC Wafers, as the cleaning process is very time consuming as well as incomplete. Build up of flux residue on wave solder pallets will hinder the application of the flux onto the assembly and cause defects.

The solder stencil printing process sometimes includes an under wiping process. The under wiping process may further apply a solvent to either the under wiping paper or the underside of the stencil. The under wiping process can further include a vacuum system which removes the loose solder particles located inside the apertures of the stencil and any solvent in the direct flow of the vacuum. The under wiping process may not sufficiently remove excess solvent remaining on the top-side of the stencil. The process may not remove the solder residue within the apertures of the stencil.

After completion of the reflow and/or wave soldering processes, the assemblies are cleaned to remove the remaining residue or contaminants. The cleaning process applies some form of liquid, generally de-ionized water. Chemicals with relatively low flash points were used in the past, but those chemicals are expensive and some were found to be harmful to the environment. One of the more desirable chemicals used to clean assemblies is water. Water, or other cleaning solutions with similar flash points, is difficult to dry in a short time period. The desirable outcome of the drying process is for components and the module to be sufficiently dried to preclude corrosion. Various processes and devices are available to dry electronic modules.

In one case, hot air is blown over and across the module with sufficient velocity, volume and thermal content to evaporate some of the moisture and urge some of the remaining moisture off the module. The limitations of this are that the dryers require a great deal of thermal energy and large capacity air blowers to provide sufficient drying. Additionally, these dryers are generally loud and require sound dampening. Drying depends on convection of hot gases past the module. The rate of drying decreases after a portion of moisture has been removed. The last few points of moisture removal take the longest and increase the cost of drying. If one attempts to increase the temperature of the drying gas, there is a risk of thermally damaging the electronic components on the module. The efficiency of drying is proportional to the temperature of the drying gas. Thermally damaging the module sets a practical upper limit for the gas temperature. Additionally, this process continues to be limited when moisture is trapped in components such as connectors.

In another case, infrared energy is applied to the module in an attempt to evaporate excess moisture. This process is somewhat limited by the time required to dry any excess moisture. Because of this limitation, infrared dryers are often used in conjunction with hot air dryers. Infrared energy transfers heat to the exposed surfaces; where the infrared energy would have a difficult time to evaporate entrapped moisture from within pockets of components such as connectors or under components designed to have a space between them and the surface of the PCB, such as ball grid array packages and Direct Chip Attach or Flip Chip.

Solder Stencil printers do not have any known means of drying other than the paper used to wipe the underside of the stencil, and the under wipe paper is not conducive to removing moisture.

In another case, reference is made to U.S. Pat. No. 5,228,614 which teaches a method of drying objects in a perforated drum. Hot gas and sonic energy are used to dry the food objects which are tumbled in the perforated drum, and upon sufficient drying, the objects are removed from the drum. The limitations of this patent are that electronic modules cannot be tumbled in a drum and are most often processed on a conveyor to preclude damage to the module.

In yet another case, reference is made to U.S. Pat. No. 3,592,395 filed Sep. 16, 1968, to Lockwood, et. al. This dryer uses pulsating hot gas and sonic energy to dry a stirred slurry. This dryer readily handles slurries or other fine powdery materials. This type of dryer would not work with electronic modules as any stirring of electronic modules would cause mechanical damage to the modules.

In yet another case, reference is made to U.S. Pat. No. 5,113,882 filed Aug. 28, 1990 to Gileta. A dryer system for a liquid cleaning apparatus has a dehumidifier to remove vapors, droplets of liquid cleaning agent and recirculate dry gas onto workpieces moving on a conveyor. Gileta teaches lowering the relative humidity within the atmosphere to increase the efficiency of the drying of printed circuit assemblies. Ultrasonic transducers are used in wave soldering technology to atomize liquid flux into a fine mist and transferring the flux in mist form from the source reservoir to the bottom side and into the plated through holes of the module. This is commonly referred to as a spray fluxer.

It can be recognized that improvements made to the drying process of modules, can also be utilized in the drying processes applied to tooling as well as stencils within solder printers.

While each of these improvements has contributed to the art, the limitations of these processes continue to be challenged.

Thus, what is desirable, is a means to reliably clean and dry electronic modules and tooling utilizing a minimal amount of energy and time and precluding any mechanical or thermal damage to the module.

SUMMARY OF THE INVENTION

The present invention addresses the deficiencies in the art by applying acoustic pressure waves and vibrational energy to the screen printing process to provide the abilities to apply small depositions of solder paste onto Printed Circuit Boards, IC Wafers, and the like.

The present invention further addresses the deficiencies in the art by applying acoustic pressure waves and vibrational energy proximate to the surface of the module or tooling such that the energy aids in the improvement of drying of electronic modules.

The acoustic energy applied to solder paste during the process of separating the stencil and the PCB increases the separation of the solder paste from within the solder stencil aperture.

The pulsating energy increases the drying efficiency over the prior art solutions by atomizing moisture droplets into a fine mist, as well as allowing the combined use of prior art solutions such as hot air blowers and infrared energy. The deficiencies within the present art may further be addressed by including the same vibrational energy in conjunction with the cleaning fluid during the cleaning process to further aid in cleaning the object.

Aspects of the present invention respective to the Print Release portion of the Present Invention:

One aspect of the present invention is to increase the speed of release of a material from a stencil and increase the quality of the resulting material deposition.

A second aspect of the present invention is to increase the repeatability and overall quality of release of a resulting deposition without deforming the deposition.

The invention comprises a method and apparatus used to apply a material in a pattern onto the surface of an object using a stencil with apertures. The invention optimizes release of the material from the apertures.

The present invention preferably uses equipment known in the art, including a stencil with at least one aperture, a means to align the stencil to a desired location on an object, a means to place material onto the stencil and into the apertures, a means to separate the stencil from the object, and a sound pressure wave generator.

The invention includes an apparatus and a method for screen printing electrical and electronic assemblies. Use of the new apparatus and method improves release of material from the apertures of a stencil. The preferred method and apparatus disclose the application of sound waves or other vibrational energy to overcome the surface tensional forces and other forces that cause the material to stick to the stencil. The sound waves or other vibrational energy are preferably transferred to the stencil or to the material, to create shearing forces between the material and the aperture sides. The vibrational energy excites the stencil and the medium within the apertures. Because the stencil and the medium have different natural frequencies and dampening factors, they move at different frequencies. This difference in motion cause the shearing forces. These shearing forces may allow the material to slide downward relative to the upward movement of the stencil, and allow the material to remain on the object, resulting in a uniform deposit at the desired location on the object. When sound pressure waves are used, they may apply additional pressure to the material within the apertures, where the pressure assists in separating the material from the aperture. Gravity and the tact forces between the object and the material will also aid in the complete transfer of the material from the aperture to the object.

The preferred means for creating and applying vibrational energy is to use sound waves, preferably with a small amplitude and a high frequency. This may result in an oscillation of the stencil perpendicular to the plane of the stencil and a vibration of the material. The vibrational energy preferably may be transferred from a speaker or horn to the material and the stencil through the air. Not only may the sound waves oscillate the stencil; the sound waves may also apply downward pressure to the material. Alternatively, the vibrational energy may be transferred from an offset motor, piezoelectric transducer, pancake motor, or any similar vibrational source that may be coupled to the foil of a stencil or transmitted through the air.

One advantage of transferring the vibrational energy either via pressure wave through air or via an attachment to the surface of the stencil is to ensure the oscillatory motion of the stencil material is primarily perpendicular to the plane of the stencil, and is directed at the material. Additionally, this method lessens the vibrational energy that is transmitted throughout the rest of the equipment. The vertical motion will lessen any horizontal motion of the stencil. Horizontal motion of the stencil may cause the material deposition to slump or otherwise to alter the preferred geometry.

Vibrational energy may alternatively be applied to the object. However, applying the vibrational energy to the object may cause the object to move horizontally affecting the resulting geometry of the material deposition possibly detrimentally. The preferred result is a repeatable deposition of material with a minimal volume of material remaining within the apertures of the stencil. This is particularly useful where the surface area of the sides of the stencil apertures is relatively large compared to the area of the cross sectional opening of the aperture.

Aspects of the present invention respective to the Cleaning and Drying portion of the Present Invention:

One aspect of the current invention is to provide a means to apply acoustic pressure waves to the desirable side of a module causing the atomizing of excess moisture.

A second aspect of the present invention is the use of Ultrasonic sources for the acoustic pressure waves.

A third aspect of the present invention is to provide a means to use acoustic pressure waves to atomize moisture in small openings, crevices and hard to reach places.

A fourth, aspect of the invention is to combine at least one of acoustic pressure waves and vibrational energy to prior art solutions such as hot air knives allowing improved efficiency and lower time and energy costs.

A fifth aspect of the present invention is the ability to dry tooling such as wave solder pallets or solder stencils.

A sixth aspect of the present invention is the inclusion of a vibrational energy source within an under stencil cleaner within an automated or semi-automated solder paste printing apparatus.

A seventh aspect of the present invention is the inclusion of a vibrational energy source in conjunction with a fluid to aid in the cleaning process.

An eighth aspect of the present invention is the inclusion of a vibrational energy source in conjunction with the cleaning process of an under stencil wiper.

A ninth aspect of the present invention is the inclusion of a vibrational energy source to atomize residual moisture on stencils.

A tenth aspect of the present invention is the inclusion of a vibrational energy source to atomize residual moisture on stencils, used in conjunction with an under stencil cleaner.

An eleventh aspect of the present invention is the combination of using the vibrational energy source for both cleaning and drying.

A twelfth aspect of the present invention is the inclusion of a vibrational transfer medium placed between the vibrational energy source and the object.

A thirteenth aspect of the present invention is the use of air to transfer the vibrational energy to the object.

A fourteenth aspect of the present invention is the use of at least one of ultrasonic transducer, speaker, tuning fork, horn, and sonar transducer to generate the vibrational energy.

A fifteenth aspect of the present invention is the application of the disclosed technology within an automated in-line cleaner.

A sixteenth aspect of the present invention is the application of the disclosed technology within an automated stencil cleaner.

A seventeenth aspect of the present invention is the application of the disclosed technology within an automated solder printer.

The present invention comprises an apparatus used to apply acoustic pressure waves and resulting vibrational energy to a module to atomize moisture during the drying phase of assembly of the module. The apparatus preferably includes equipment known in the art: a conveyor to move the module through an in-line cleaner wash, rinse, and drying sections, which can include hot air blowers and infrared heaters. Alternatively, the present invention may be included within other equipment known in the art such as stencil cleaners and batch cleaners or solder printers.

The present invention discloses the application of acoustic pressure waves and resulting vibrational energy to atomize excess moisture and entrapped moisture in hard to reach cracks and crevices, thus overcoming the surface tensional forces and allowing increased efficiency of the hot air dryers and the infrared heaters. The acoustic pressure waves, generated by a transducer and transferred to the module through the air, will impinge the module at the angle proscribed and not be substantially affected by the volume or velocity of the hot air flow caused by the hot air dryers.

The present inventions further discloses the application of vibrational energy through close proximity to dry preferably planar tooling such as stencils where heat is not desirable.

The present invention further combines the enhancements of the print release portion of the present invention, the cleaning portion of the present invention, and the drying portion of the present invention. The combination of at least two of the contributors directs a method and apparatus forward for utilizing screen printing technology for applying solder bumps to IC Die or wafers, resulting in a repeatable, low cost solution.

BRIEF DESCRIPTION OF THE DRAWINGS

FIG. 1a through 1d describes the prior art, presenting the features for screen printing solder paste, and the like, onto a printed circuit assembly, integrated circuit wafer, and the like.

DETAILED DESCRIPTION OF THE INVENTION

Figure 1A:
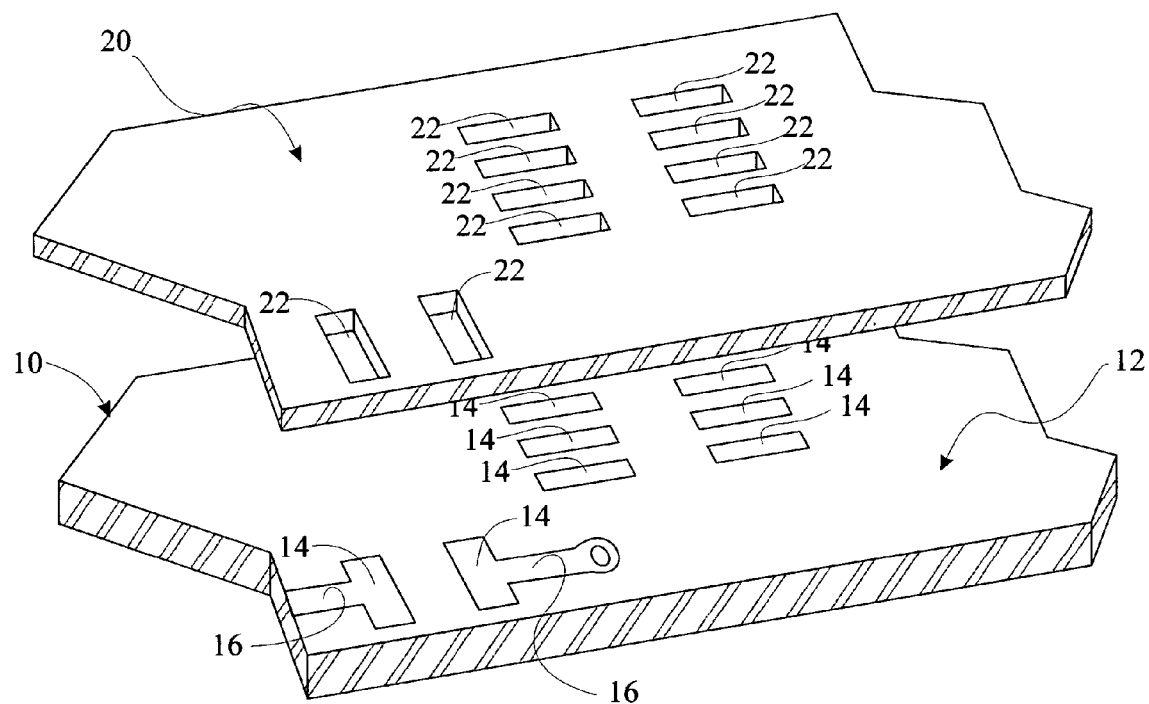
Figure 1B:
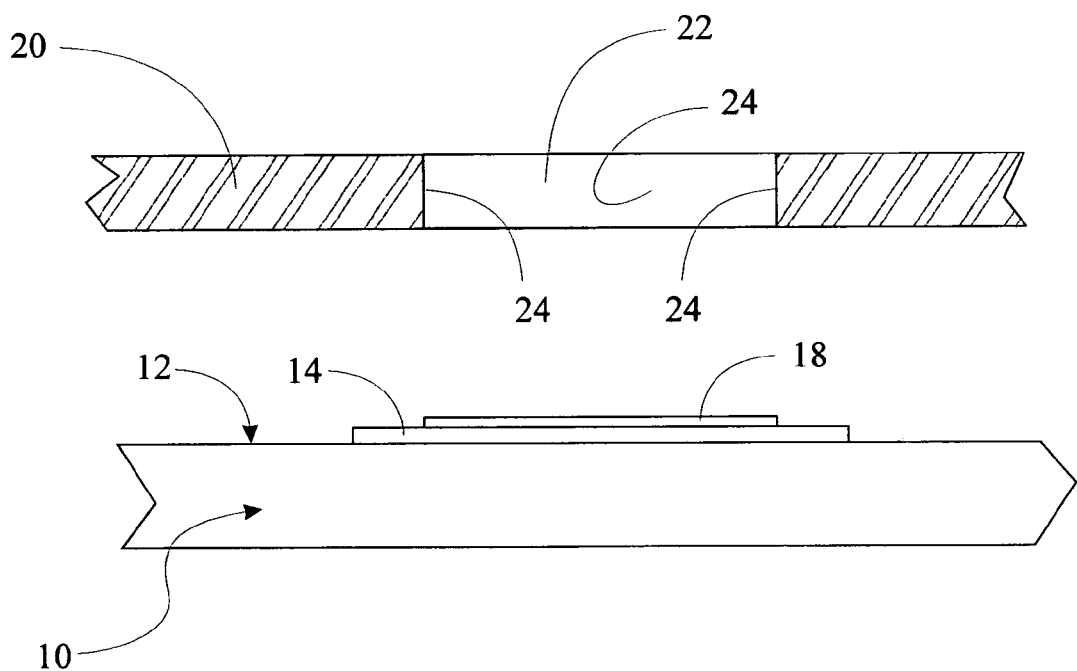
Figure 1C:
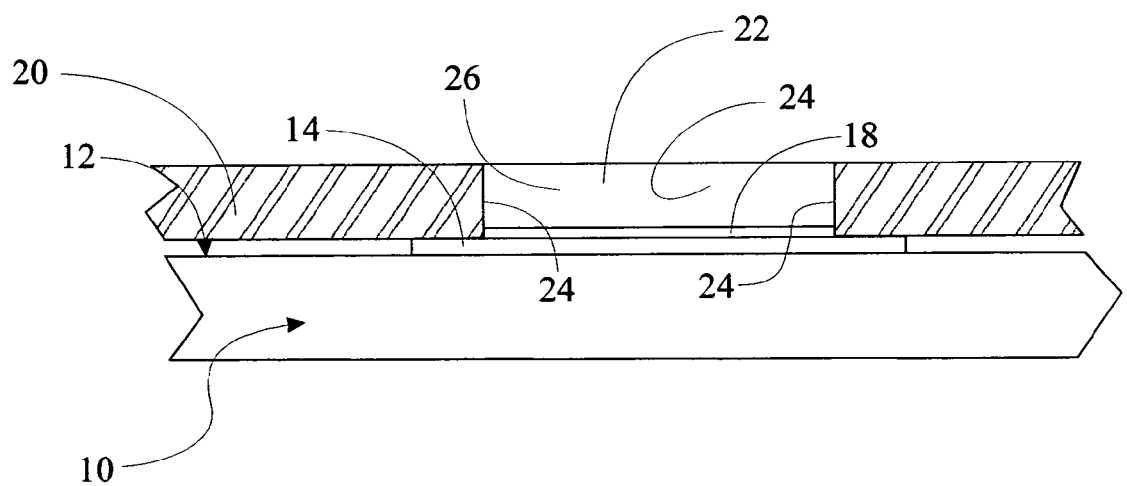
Figure 1D:
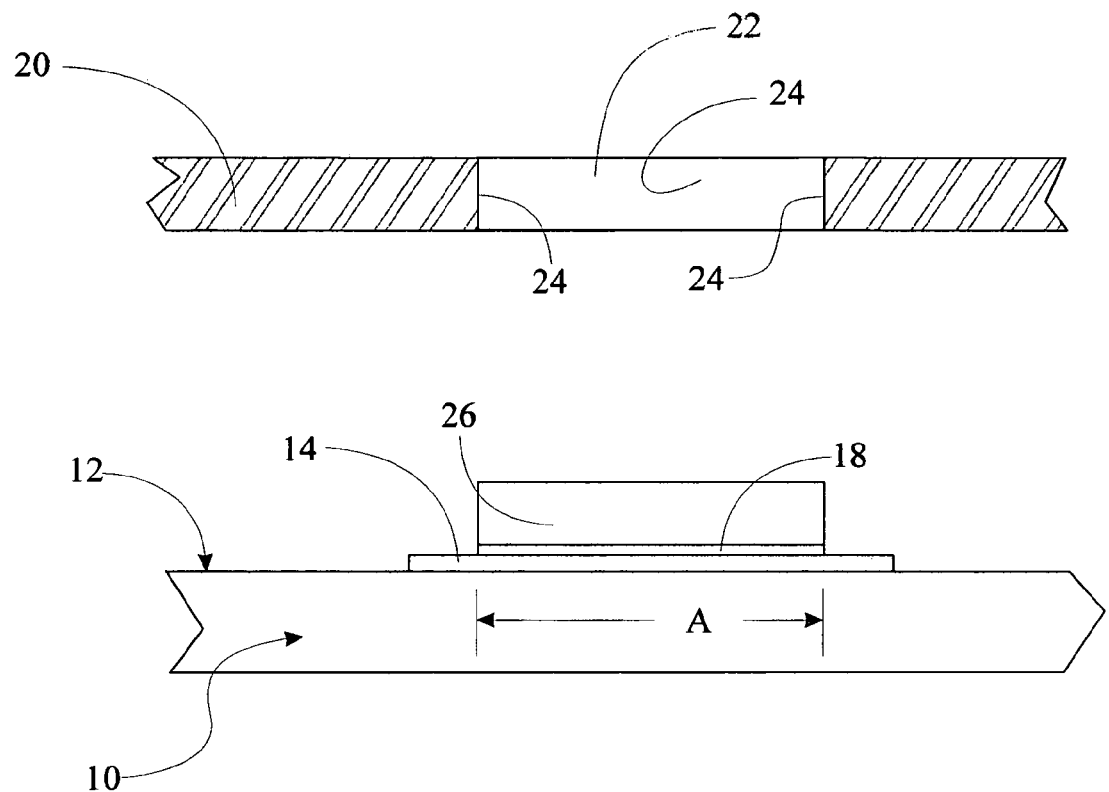
Figure 2:
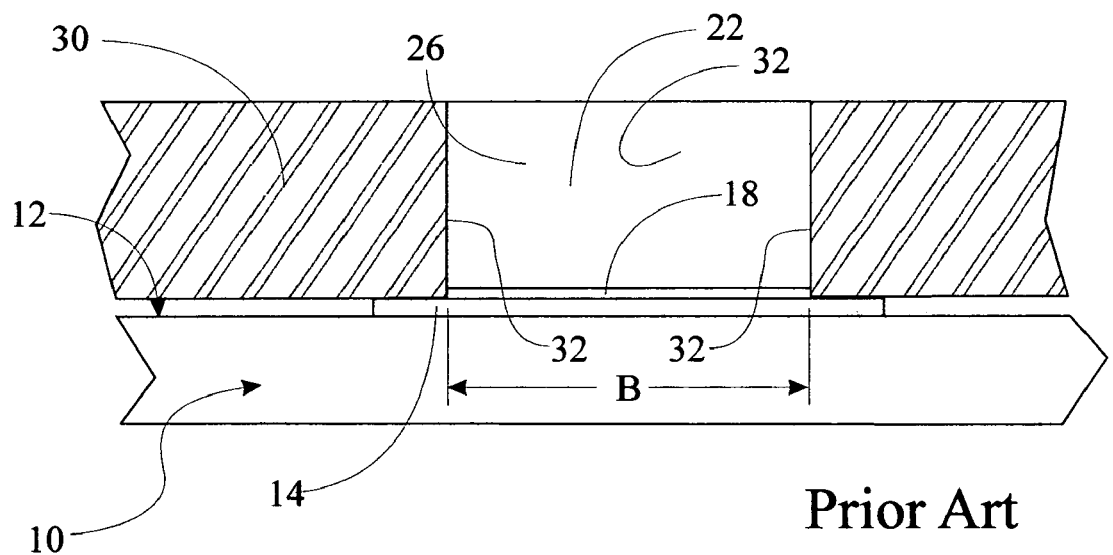
FIG. 2 teaches the limitations of the prior art, describing an aspect ratio.
Figure 3:
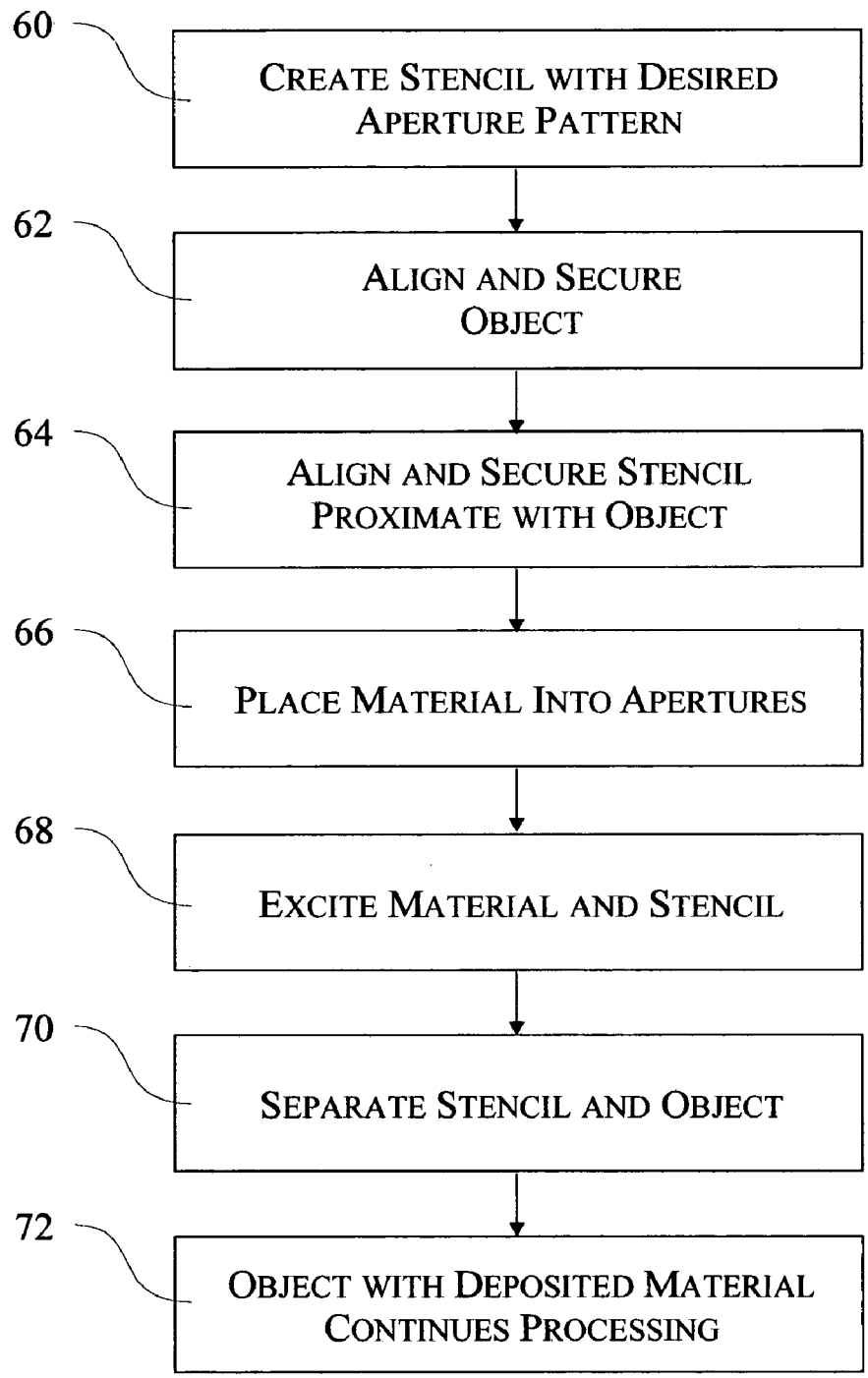
FIG. 3 Is a flow diagram showing the steps of the print release portion of the present invention.

FIG. 3 is a flow diagram showing the preferred screen printing steps of the present invention. FIGS. 1B, 1C and 1D illustrate some of the steps in the process. The first step 60 is the fabrication of a screen or stencil 20. A stencil is a sheet like device created by fashioning apertures into a foil. Stencils may be fabricated using many methods that are known in the art including but not limited to, precision milling of a raw foil preferably using a programmable computer controlled mill, chemically etching using photo-developed or equivalent masking images on a raw foil and applying a predetermined chemical which will corrosively remove the exposed portions of the foil, an additive process which uses a negative pattern and bonds particles of metal around the pattern to form a foil, or laser cutting using a programmable, focused laser beam to cut through the foil.

The second step 62 in the preferred screen printing process is to align a Printed Circuit Board 10 in a manner to support and secure the Printed Circuit Board 10. The Printed Circuit Board 10 may be secured to a temporary holding mechanism to reduce horizontal or vertical movement during the deposition process.

The third step 64 is to align the stencil 20 proximate the Printed Circuit Board 10. The stencil 20 preferably is aligned so that the pattern of aperture(s) 22 defined by the stencil 20 are arranged to leave the desired deposits in the desired location. The stencil 20 is affixed to the object on a mounting mechanism by means known in the art.

The forth step 66 is to place material into the aperture(s) 22. The material 26, is preferably placed into the aperture(s) 22 by means known in the art. It is known in the art to place a quantity of material 26 onto the stencil and use a squeegee to move the material 26 into the aperture(s) 22.

The fifth step 68 is to excite the material 26 and the stencil 20 via the application of vibrational energy. Preferably, vibrational energy is created and transferred through the air using a speaker or horn located above and proximate the stencil 20. This can be applied prior to and/or during the succeeding step. Alternatively, the vibrational energy may be created via a vibration source coupled directly to the stencil 20.

The sixth step 70 of the preferred process is to separate the stencil 20 and the Printed Circuit Board 10.

The seventh and final step 72 of the preferred process is to remove the Printed Circuit Board 10 from the mounting mechanism and continue processing.

Figure 4:
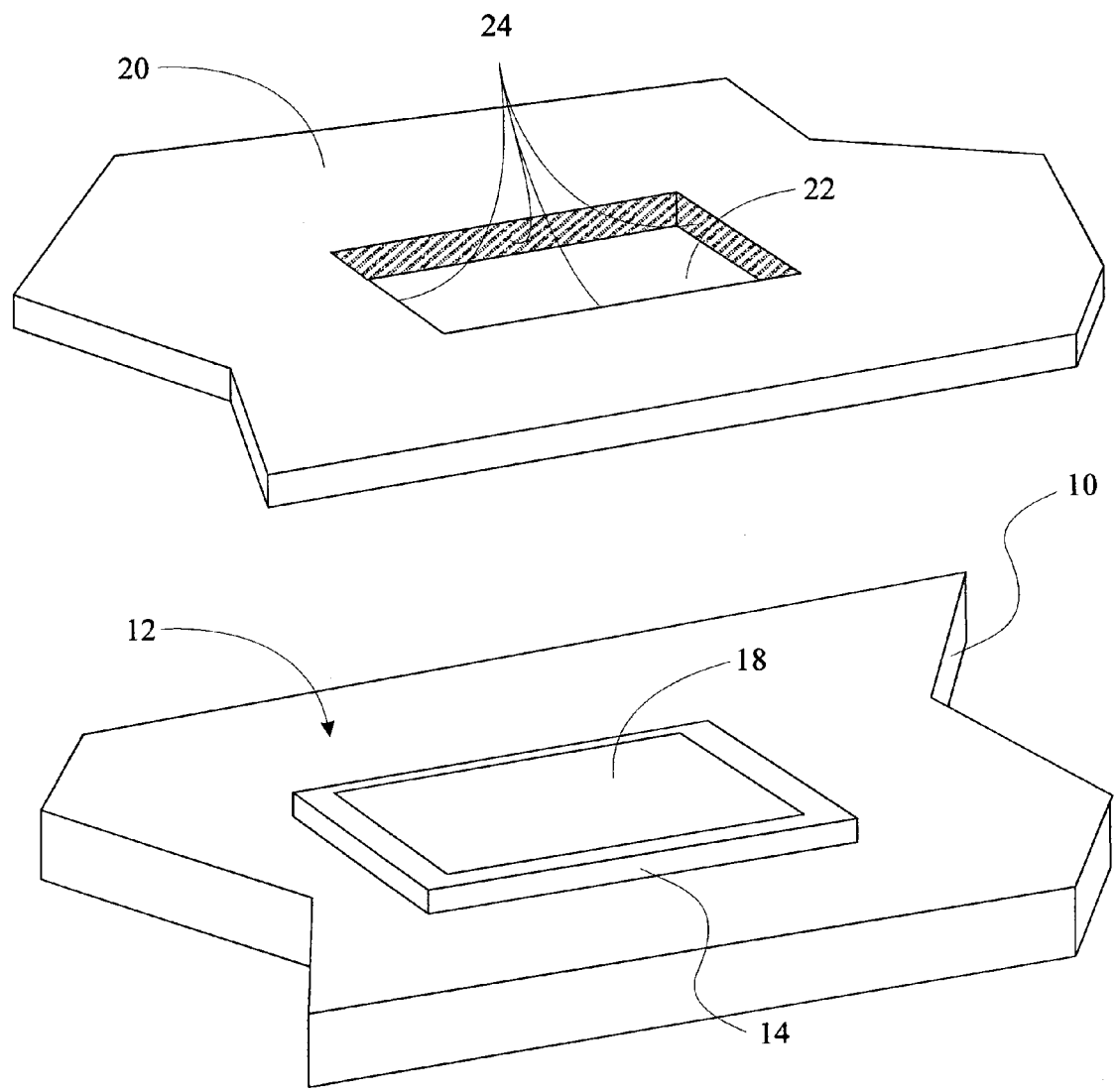
FIG. 4 is a perspective view of a stencil showing a single aperture above an object and the desirable location for deposition of a material.

FIG. 4 illustrates an isometric view of the preferred stencil 20 including an aperture(s) 22. Most stencils have a plurality of aperture(s) 22, but one is all that is necessary to describe the invention claimed herein.

Various factors contribute to the quality of the transfer of the material 26 from the aperture(s) 22 to the Printed Circuit Board 10. These include but are not limited to: the horizontal geometry of the aperture(s) 22, the cross sectional geometry of the aperture(s) 22, the microfinish of the wall of the aperture(s) 22, and the shearing properties and tact properties of the material 26.

Figure 5:
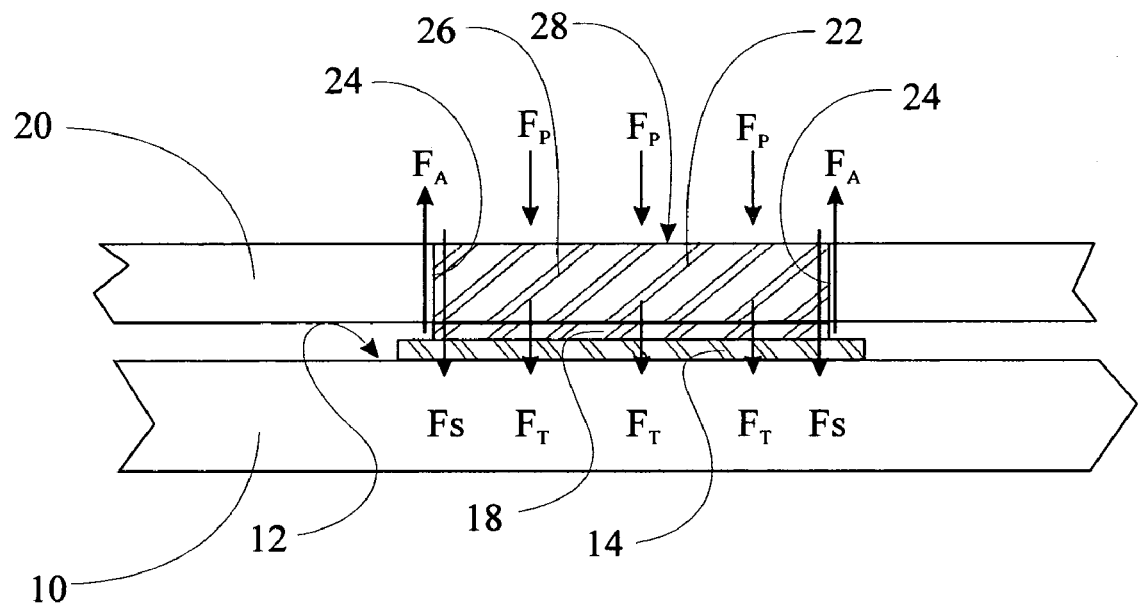
FIG. 5 is a cross sectional view that illustrates the forces exerted on the material during the preferred process to separate a stencil and an object.

FIG. 5 is a cross sectional drawing of a portion of the stencil 20 located proximate to and aligned to the Printed Circuit Board 10, as described in the third step 64 of FIG. 3. The aperture(s) 22 is aligned to the desired target area 18 on the material deposition surface 12 of the Printed Circuit Board 10. In this case, a pad(s) 14 is located on the Printed Circuit Board 10. After the material 26 passes across and into the aperture(s) 22 using a squeegee (shown later). When the stencil 20 and Printed Circuit Board 10 are separated, either by moving the Printed Circuit Board 10 away from the stencil 20 or by moving the stencil 20 away from the Printed Circuit Board 10 or both, a number of forces are created. The primary force that makes the material 26 stick to the pad(s) 14 on the material deposition surface 12 is the tact force ($F_T$)

created at the interface between the material 26 and the pad(s) 14. The primary force that causes the material 26 to resist release from the aperture(s) 22 is the tact force ($F_A$) at the interface between the material 26 and the aperture side-walls 24 of the aperture(s) 22, which induces a shearing force ($F_S$) within the material 26.

The present invention preferably introduces sound pressure waves or vibrational energy (illustrated later) to counteract the forces opposing separation of the solder stencil 20 and the material 26 and resulting in motion of the stencil 20 and the material 26. An added feature of the preferred embodiment is the introduction of a downward pressure, resulting in a downward force ($F_P$) on the material 26 that aids in overcoming the shearing forces ($F_S$).

Figure 6:
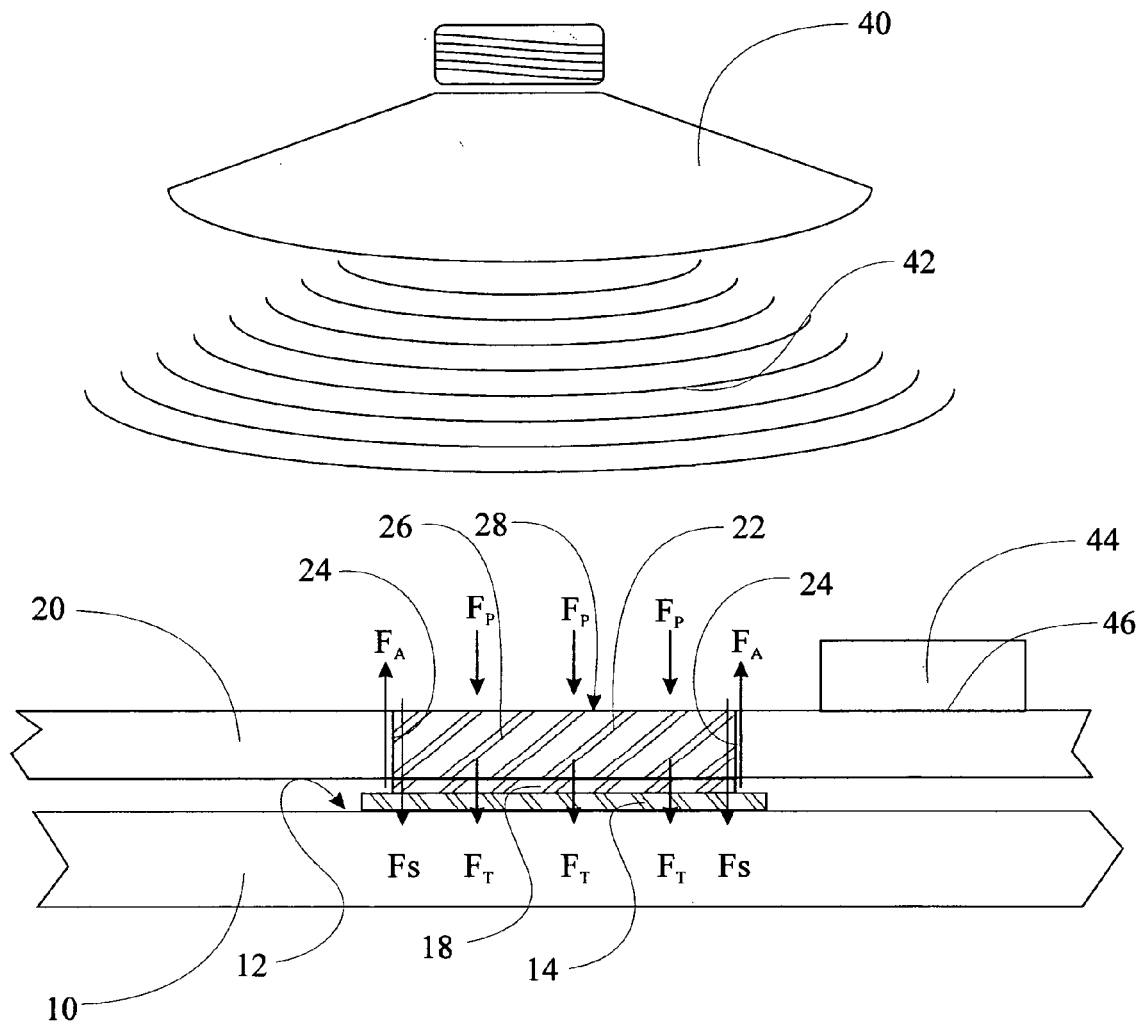
FIG. 6 is a cross sectional drawing which illustrates two preferred methods of transferring the vibrational forces to the material and stencil to assist in the release process.

FIG. 6 is a cross sectional drawing illustrating two preferred methods to transfer vibrational energy 42 to the stencil 20 and the material 26, resulting in a vibrational motion and a pressure ($F_P$) applied to the material 26. The vibrational energy 42 preferably originates from a transponder 40 which transmits vibrational energy 42 through the air to the stencil 20 and the material 26. The transponder 40 is preferably an ultrasonic horn that transmits sound waves of small amplitude and high frequency. Alternatively, the preferred transponder may be, for example, a tuning fork or speaker (such as a ribbon speaker or an array of speakers). The vibrational energy 42 transmitted by the transponder 40 cause the stencil 20 to oscillate perpendicular to the plane of the stencil 20, as well as applying a pressure ($F_P$) to the material 26. The vibrational energy 42 have at least two positive influences. First, the resulting vibration helps to overcome the tact forces ($F_A$) at the interface between the stencil 20 and the material 26. Second, the downward pressure, in addition to aiding the material 26 release, helps make the material top surface 28 of the resulting deposit more uniform.

Alternatively, the vibrational energy 42 may originate from a second transponder 44 that transmits vibrational energy through a mechanical coupling means 46 between the second transponder 44 and the stencil 20. The second transponder 44 preferably comprises a piezoelectric transponder. The alternative second transponder 44 may include an off-balanced motor or a mass resonant transponder. The vibrational energy 42 transferred to the stencil 20 may cause a resultant motion of the stencil 20 in a direction perpendicular to the plane of the stencil 20. The resultant motion assists in releasing the material 26 from the aperture(s) 22, enabling the transfer of the material to the target area 18 or pad(s) 14 on the Printed Circuit Board 10.

Figure 7:
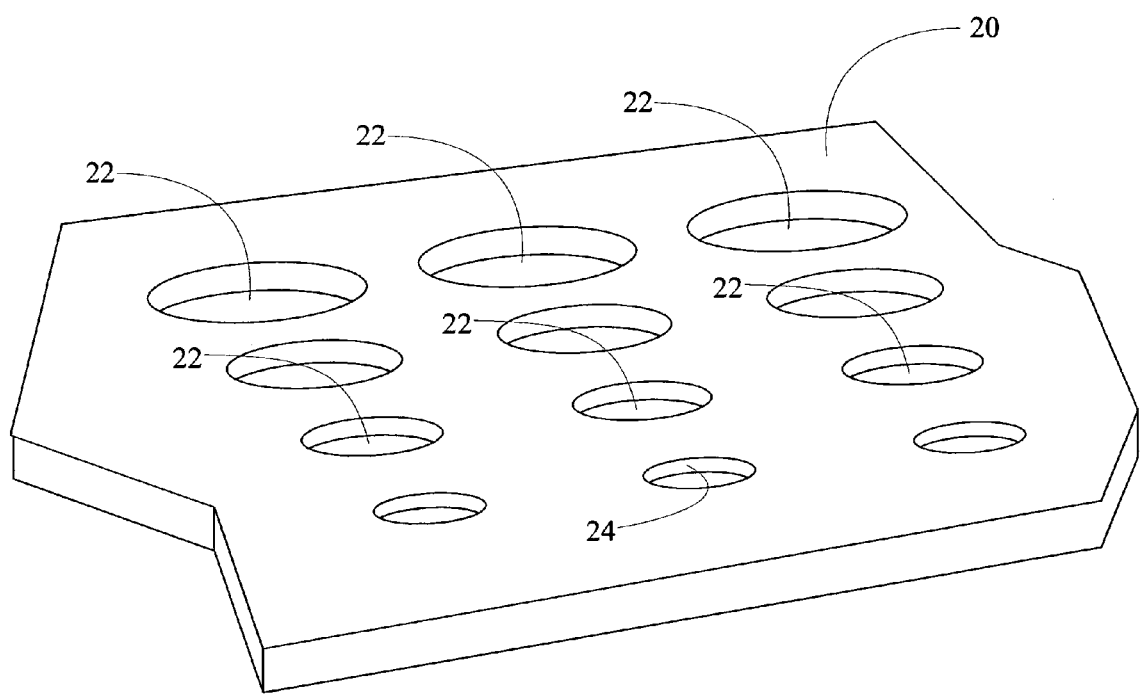
FIG. 7 is an isometric view of a test stencil used to validate the present invention.

FIG. 7 illustrates a section of a stencil 20 used for experimentation for validating the present invention. The stencil 20 comprising a series of round aperture(s) 22, whereby the apertures vary in diameter. Since the stencil maintained a constant thickness, the aperture(s) 22 with the smaller diameter resulted in a higher aspect ratio or the ratio of the surface area of the aperture side-wall 24 to the target area 18. The smaller the diameter, the higher the aspect ratio and the more difficult the separation process.

Figure 8:
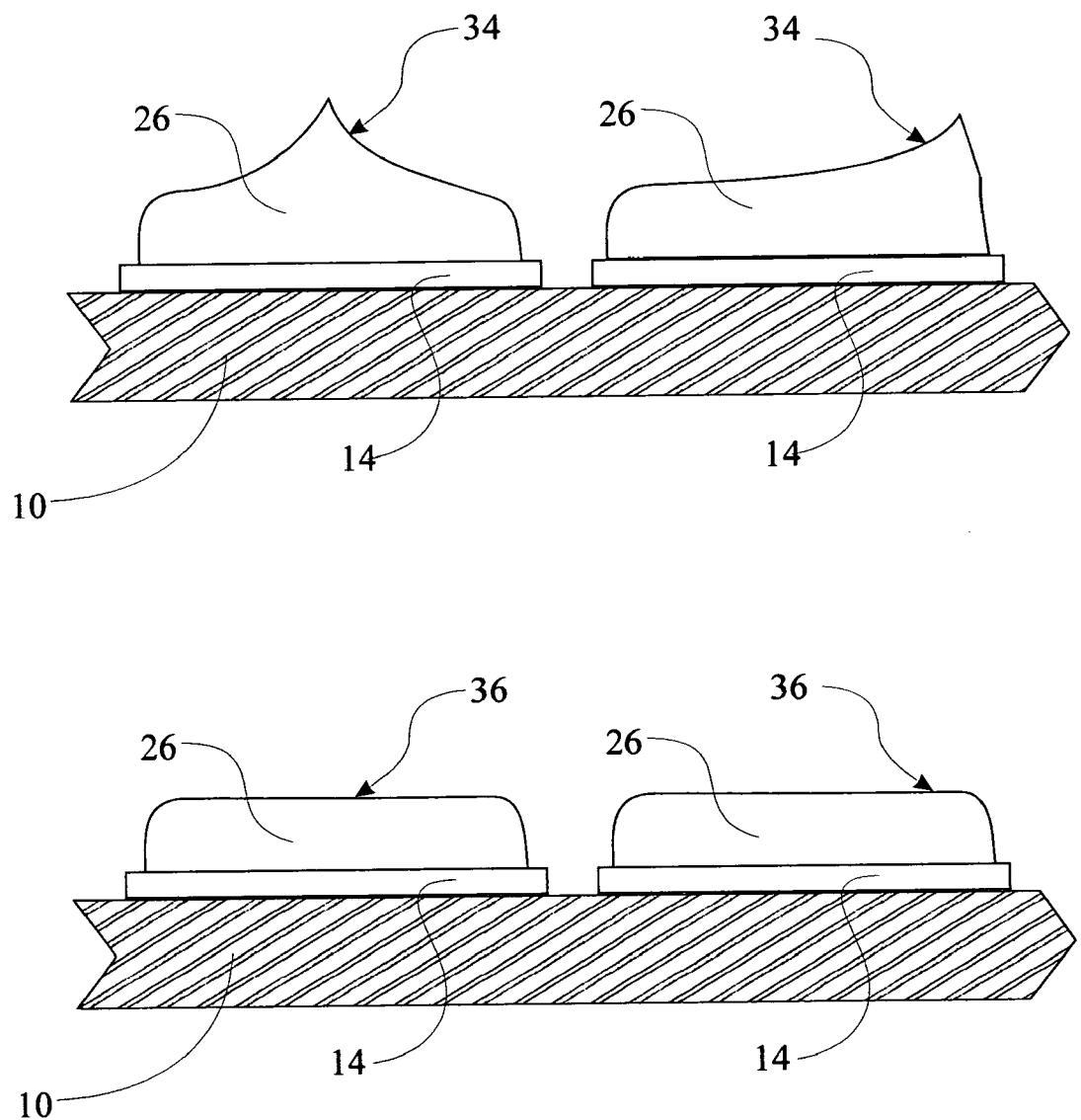
FIG. 8 is a cross sectional view of a deposition of solder paste onto a receiving pad illustrating the advantages found during experimentation of the present invention.

FIG. 8 illustrates the results of applying the present invention to the stencil 20 of FIG. 7. When applying the material 26 to the pad(s) 14 of a Printed Circuit Board 10, the current process resulted in deformed solder depositions 34. When applying the material 26 to the pad(s) 14 of a Printed Circuit Board 10, the inclusion of the present invention in the printing process resulted in uniform solder depositions 36.

Figure 9:
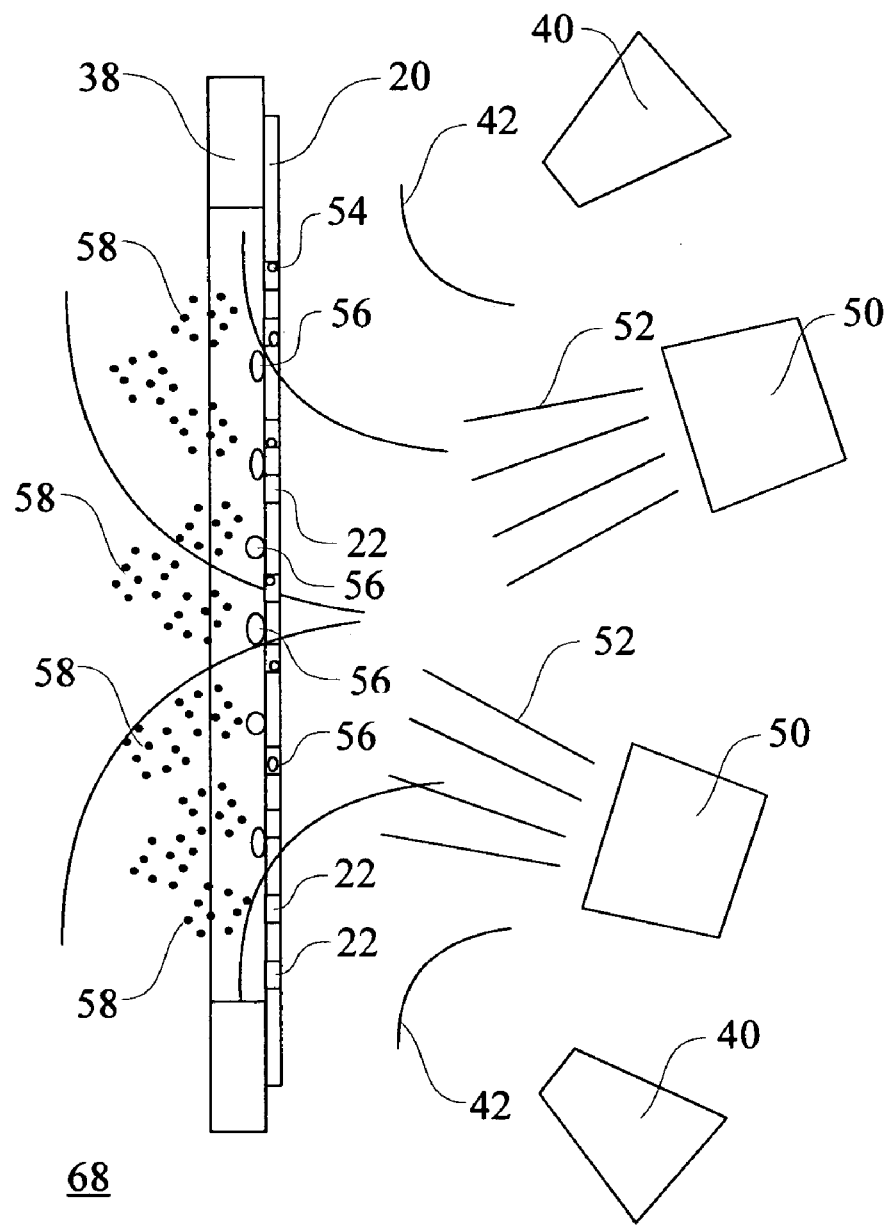
FIG. 9 is a sectional side view of a stencil cleaner in the drying cycle in conjunction with the use of ultrasonic transducers.

FIG. 9 illustrates an embodiment utilized to assist in the drying process used during the cleaning of tooling such as stencils and wave solder pallets. A stencil 20 is mounted within a stencil frame 38. The stencil 20 includes aperture(s) 22 which are used to transfer a pattern of solder paste to the PCB during the assembly process. Upon completion, the solder paste must be removed from the stencil and from within the aperture(s) 22. The optimal process to remove the solder paste from: the aperture(s) 22 of the stencil is to utilize a stencil cleaner 68. A cleaning fluid is applied to the stencil 20 to remove the remaining solder paste. The cleaning fluid leaves moisture droplets 226 on the surfaces of the stencil 20 and within the aperture(s) 22. At least one transponder 40 emits vibrational energy 42 shown in the form of pressure waves which impinge the stencil 20 and the resident moisture (solvent) 56 at a predetermined angle. The acoustic and vibrational energy 42 turn the resident moisture (solvent) 56 on the stencil 20 and in the aperture(s) 22 into atomized moisture droplets 58 on the stencil and suspended in the air. By atomizing the resident moisture (solvent) 56, the process reduces the gathered volume per droplet of resident moisture (solvent) 56 and increases the surface area per droplet of resident moisture (solvent) 56. These two changes increase the rate of evaporation. Other drying methods can be employed such as heat as described later. One can recognize this apparatus may be used for drying other objects such as bare PCB'S, batch cleaning of assembled modules (200 of FIG. 16), or tooling such as wave solder pallets and squeegee blades. It can be recognized that the hot air nozzle 50 and the at least one transponder 40 may be on a varying angle or on a moving carriage (not shown) to increase the drying efficiency.

Figure 10:
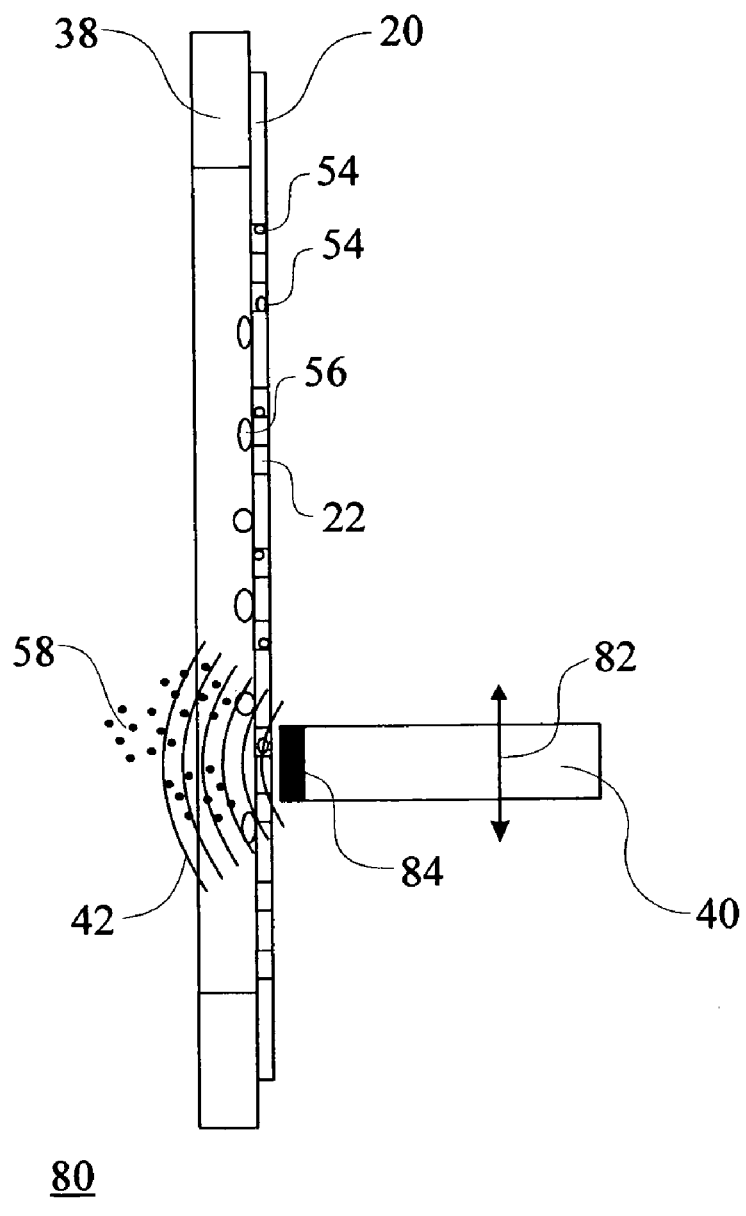
FIG. 10 is a sectional side view of a solder stencil cleaning apparatus using vibrational energy for cleaning and drying.

FIG. 10 illustrates a cross sectional view of a stencil cleaner 80 using vibrational energy 42 in close proximity to or contacting the stencil. Illustrated is a transponder 40 such as an ultrasonic horn located proximate the stencil 20, whereby the transponder 40 passes across 82 the stencil 20. A vibrational interface medium 84 can be coupled to the transponder 40 to place a thermal barrier between the transponder 40 and stencil 20 to reduce heat transfer, while mechanically transferring vibrational energy 42. The vibrational energy 42 can be used in conjunction with fluids to aid in removing solder paste residue (not shown) from the stencil 20 and aperture(s) 22. The same transponder 40 can be used for both cleaning assistance and drying.

Figure 11:
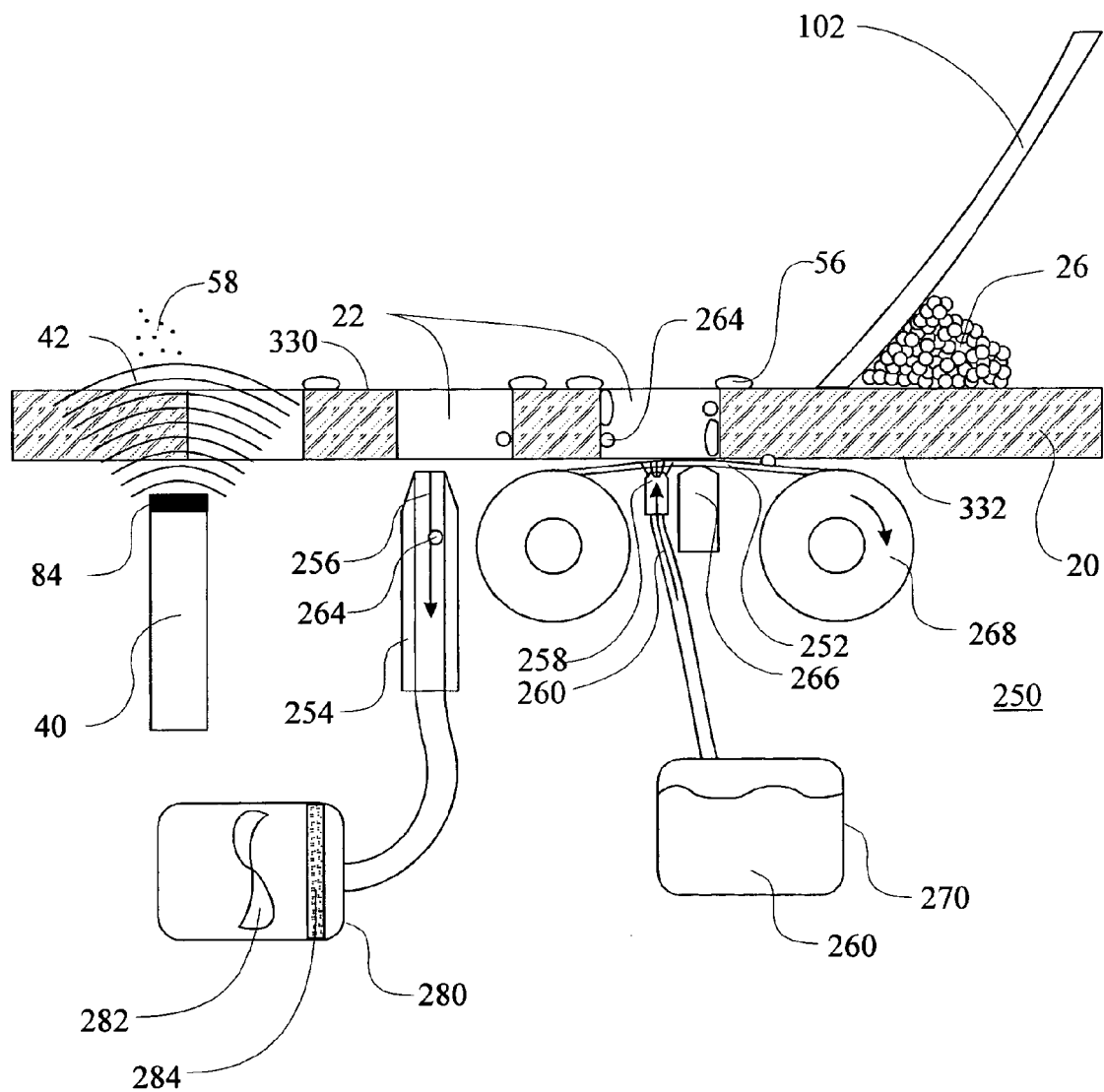
FIG. 11 is a sectional side view of a solder stencil in conjunction with an under wiping system with the use of an ultrasonic transducer for drying.

FIG. 11 illustrates a cross sectional view of a stencil 20 and under wiping system 250 in conjunction with a preferred embodiment of the present invention. The system described would normally be found within a semi-automated or automated solder screen printer (not shown), but it can be recognized that it may be applied to other system devices. The solder screen printer includes a stencil 20 and a squeegee 102, where the squeegee 102 passes a material such as material 26 (such as solder paste) across a plurality of stencil aperture(s) 22. The stencil 20 would separate from the object, such as a printed circuit board (PCB) (not shown) depositing most of the material, such as material 26 (such as solder paste) onto the object. Solder paste residue 264 sometimes remains within the stencil aperture(s) 22 or along the bottom (contact) side of the stencil 332. Under wipe systems such as the one described with solvent 260, wiper paper 252, and vacuum system 280 are already known. The solvent dispenser 258 applies a solvent 260 from a solvent reservoir 270 generally to the under wiping paper 252. The under wiping paper 252 is transferred between the two under wiper paper handling rollers 268 and pressed against the bottom (contact) side 332 of the stencil 20 by an under wiper paper support 266. The solvent 260 soaked under wiping paper 252 passes across the stencil 20 removing the undesirable solder paste residue 264 from the bottom (contact) side 332 of the stencil 20. The wiping process leaves resident moisture (solvent) 56 inside the stencil aperture(s) 22 and on the stencil top side 330 of the stencil 20. A vacuum system 280 is introduced to remove solder paste residue 264 and resident moisture 64 from inside the stencil aperture(s) 22. The vacuum system 280 includes a vacuum fan 282 which provides a vacuum force 256 to a vacuum nozzle 254. The vacuum nozzle 254 and vacuum force 256 collects the Solder paste residue 264 and resident moisture (solvent) 56 from inside the stencil aperture(s) 22 and transfers it to a collection filter 284. The vacuum system 280 may not remove resident moisture (solvent) 56 from the stencil top side 330 of the stencil 20. An ultrasonic transponder 40 applies acoustic and vibrational energy 42 to the stencil 20, preferably without contacting the stencil 20. This may be accomplished by providing an air gap or a vibrational interface medium 84 between the transponder 40 and the stencil 20. The vibrational energy 42 causes the resident moisture (solvent) 56 to atomize into atomized moisture 58 and lift off the stencil top side 330 of the stencil 20. The preferred embodiment would be to incorporate all features into one apparatus. It may also be recognized that the transponder 40 may be incorporated within the vacuum nozzle 254. It can be recognized that other under wiping and/or under wiping vacuum systems exist or may be developed which should not limit the spirit or intent of the present invention.

Figure 12:
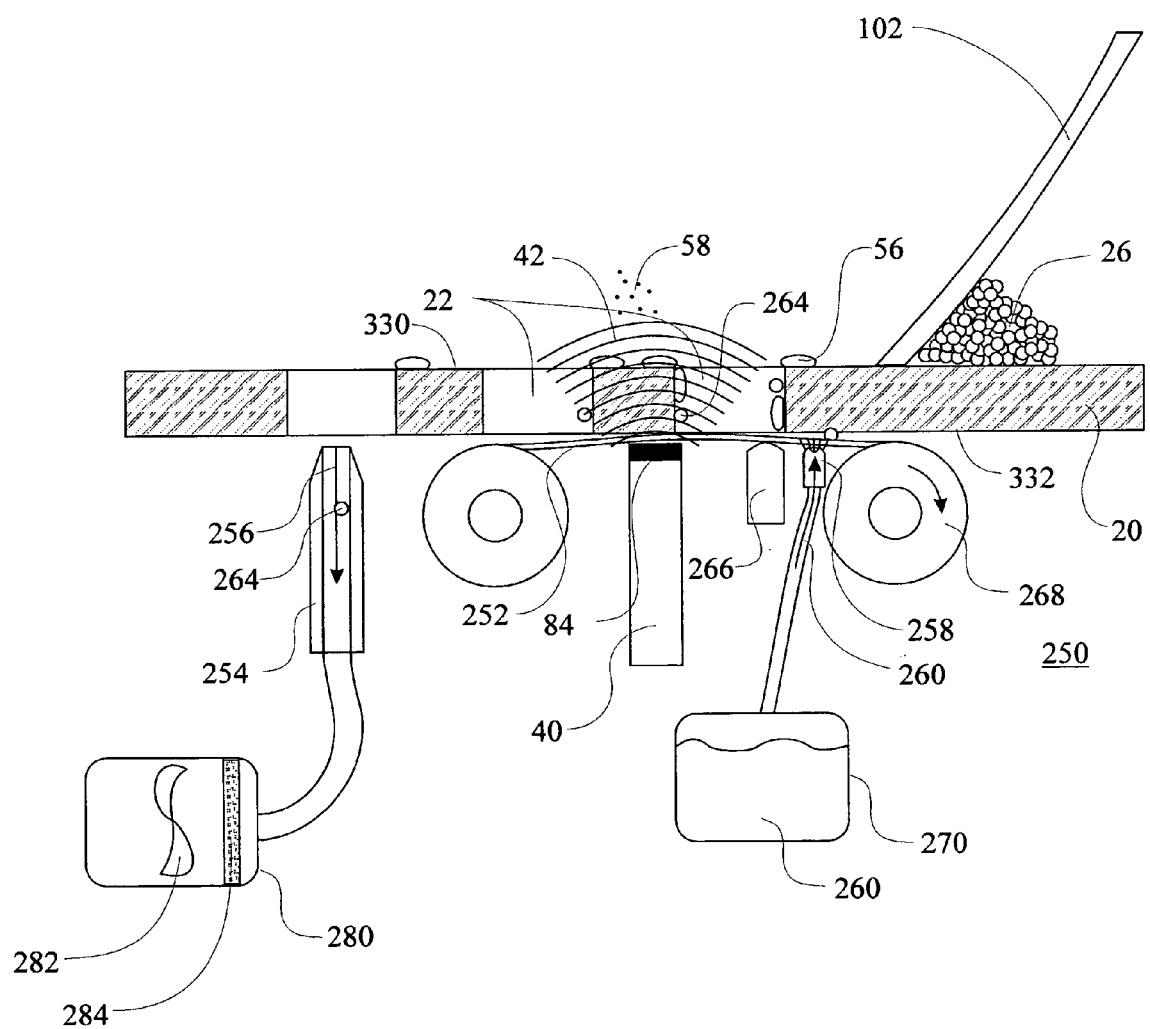
FIG. 12 is a sectional side view of a solder stencil in conjunction with an under wiping system with the use of an ultrasonic transducer for cleaning and drying.

FIG. 12 illustrates a stencil cleaning apparatus 250 similar to FIG. 11 with the additional utility of using vibrational energy 42 in conjunction with fluid 260 applied to the stencil 20 to aid in the cleaning process to further assist in loosening Solder paste residue 264 from the stencil 20 and aperture(s) 22. Fluid can be retained within the apertures by the wiping paper 252 or other mean, including surface tension. The vibrational energy 42 would further assist in drying the stencil 20 by atomizing moisture droplets 58 resident moisture (solvent) 56. A vacuum system 280 as described within FIG. 11 can further be included to remove Solder paste residue 264 and remaining resident moisture (solvent) 56. The system can be incorporated within any variation of stencil cleaning system based upon the principles described herein.

Figure 13:
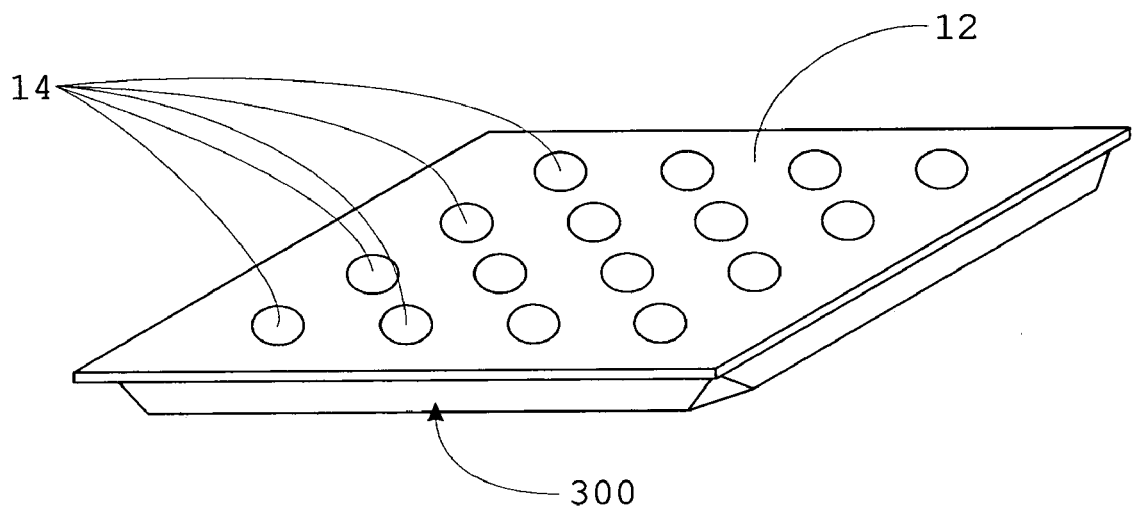
FIG. 13 is an isometric view of two bumped Integrated Circuit (IC) Packages (Ball Grid Array and a Flip Chip Wafer) that utilize solder bumping for an interconnect means.
Figure 13:
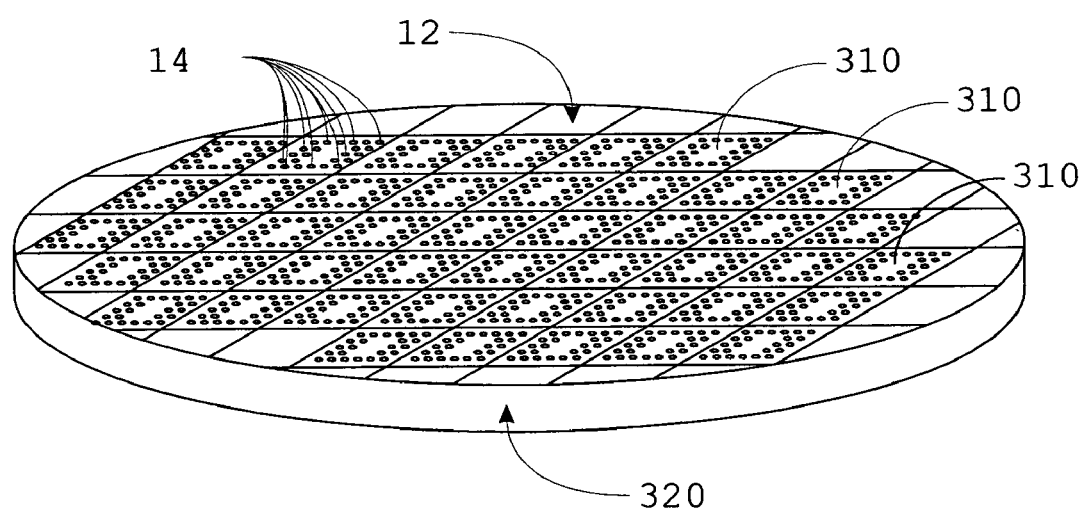

FIG. 13 illustrates two types of bumped integrated circuit packaging styles: a Ball Grid Array 300 and an Integrated Circuit Wafer 310, both illustrated prior to the placement of solder spheres. The Integrated Circuits 310 are fabricated and bumped within a single Integrated Circuit Wafer 320. Each component package 300, 310 comprises a material deposition surface 12 and respective pad(s) 14. Solder spheres or solder paste is then deposited upon the pad(s) 14, the solder is attached using a reflow process, then the component package 300, 310 is cleaned.

Figure 14:
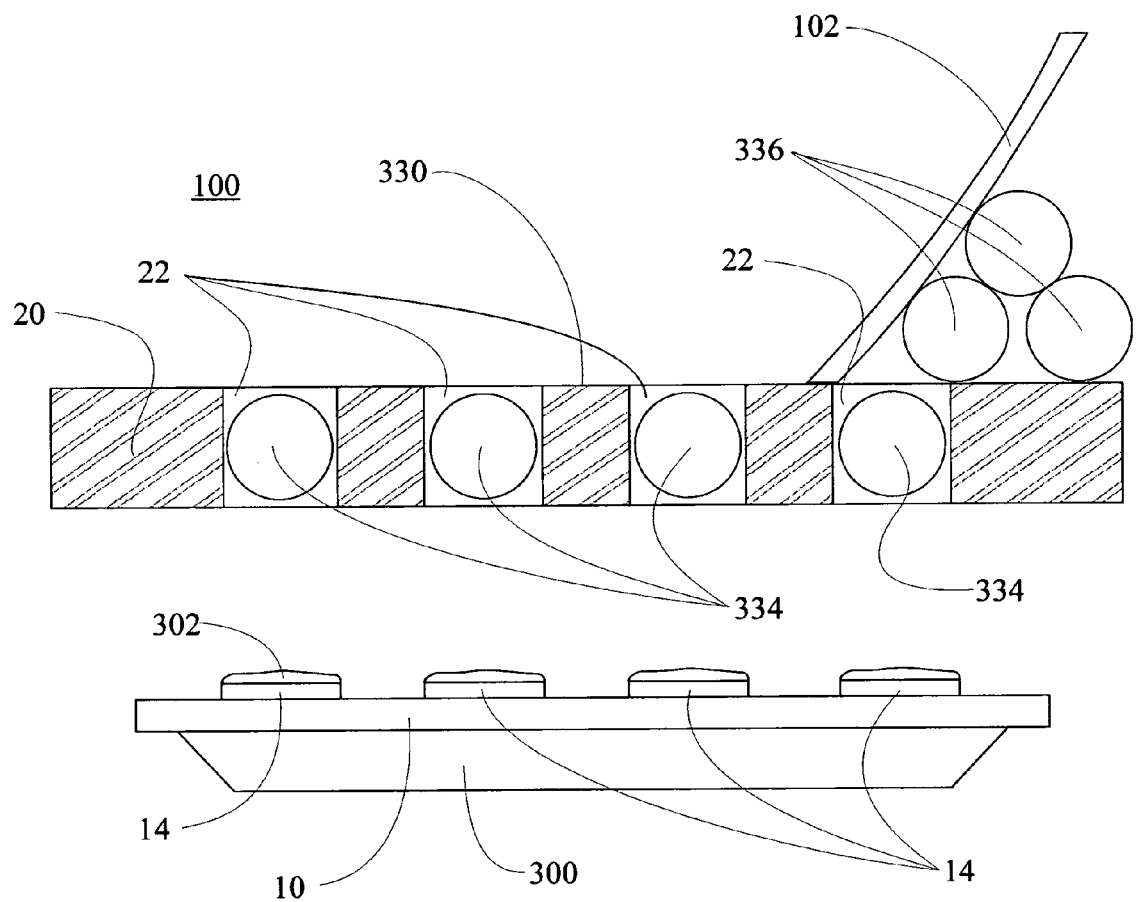
FIG. 14 is a cross sectional view of a solder sphere applicator for placing single solder spheres or solder paste onto an IC Package to fabricate a bumped IC Package.

FIG. 14 is a cross sectional view of a representative Screen Printer 100 where a volume of unorganized conductive preforms 336 are positioned within apertures 18 from the stencil top side 330. The stencil top side 330 is defined as the side of the stencil 20 opposing the side which contacts the Printed Circuit Board 10. Normally, when the conductive preforms 334 are positioned into the Screen Printer 100 from the Stencil top side 330, a tacky media 302 is first applied to the pad(s) 14, then the aperture(s) 22 within the Screen Printer 100 is located proximate the pad(s) 14 on the Printed Circuit Board 10, then the conductive preforms 334 are positioned within the aperture(s) 22. A volume of unorganized conductive preforms 336 is passed across the aperture(s) 22 using a squeegee 102, such as a squeegee (illustrated), tilting, vibrations, airflow, or any other mechanism that can be recognized by one skilled in the art. The method of loading the conductive preforms should not be considered as a means to deviate from the spirit or intent of the invention. As the unorganized conductive preforms 336 pass across the aperture(s) 22, an individual conductive preform 334 is positioned to each aperture(s) 22. When each of the individual aperture(s) 22 has a respective individual conductive preform 334 positioned, the Screen Printer 100 created the desired conductive preforms 334.

The conductive preforms 334 are transferred to the pad(s) 14, where the conductive preforms 334 are temporarily coupled to the pad(s) 14 by a tacky media 302. The present invention teaches the application of vibrational energy 42 to ensure transfer of the conductive preforms 334 to the pad(s) 14.

Figure 15:
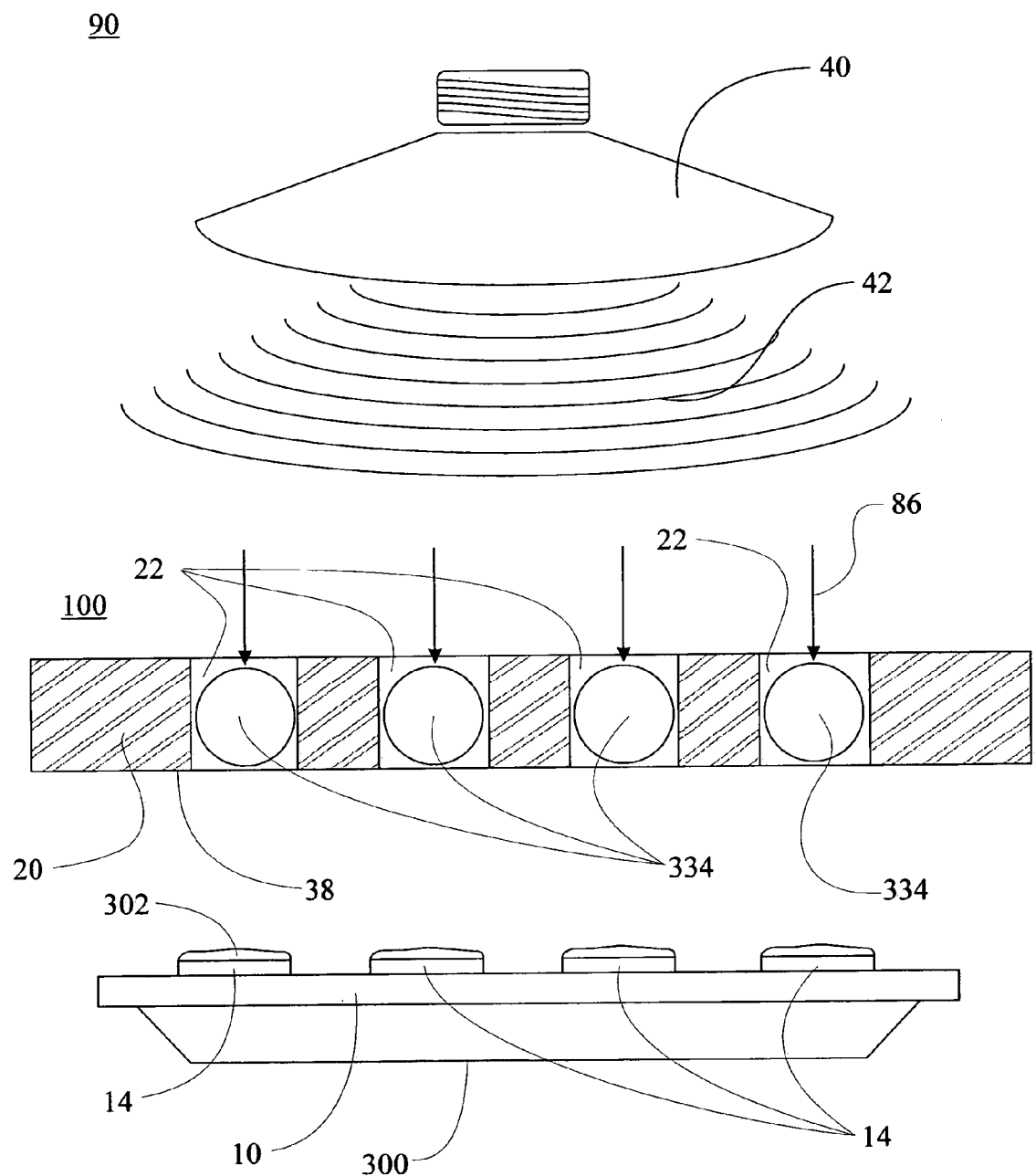
FIG. 15 is a cross sectional view of the solder sphere applicator for placing single solder spheres or solder paste onto an IC Package to fabricate solder bumps on a bumped IC Package, the solder sphere applicator using vibrational energy for assisting in the release process.

FIG. 15 is a cross sectional view of a directed sound pressure wave release apparatus 90. The sound pressure wave apparatus 90 utilizes a transponder 40 to generate vibrational energy 42. The transponder 40 may be of any known sound generating apparatus, such as speaker, ultrasonic horn, mass resonant generator, etc. understanding the effectiveness may be based upon the selected frequency or variations in frequencies, amplitude, and distance. The sound pressure waves provide a release force 86 which separates the conductive preforms 334 from the aperture(s) 22. Additionally, the vibrational energy 42 cause the individual components of the system, more specifically, the conductive preforms 334 and the Screen Printer 100 to oscillate at their natural frequencies. Since the mass and spring constant of each component is generally different, they oscillate at different frequencies, reducing friction or static forces (not shown) between the conductive preforms 334 and the Screen Printer 100 which are known to retain the conductive preforms 334 within the aperture(s) 22.

Figure 16:
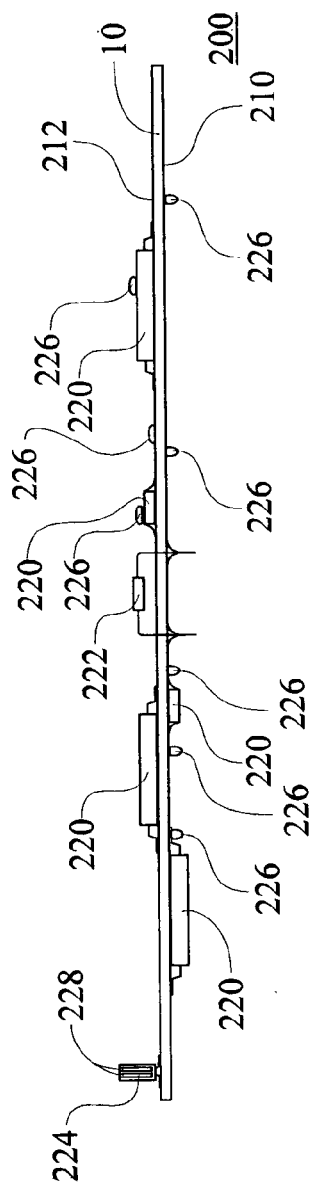
FIG. 16 is a sectional side elevation illustrating a module with water droplets on the top surface and bottom surface.

FIG. 16 illustrates a sectional side elevation of a module 200. The module 200 consists of a Printed Circuit Board 10 which has two 2 sides; a solder side 210 and a component side 212. Electromechanically attached to the illustrated Printed Circuit Board 10 are surface mount components 220, a leaded component 222, and a connector 224. An assembly with a Printed Circuit Board 10, surface mount components 220, a leaded component 222, and a connector 224 is collectively referred to as a module 200. After the module 200 is washed, moisture droplets 226 may be found on the solder side 210 and the component side 212 of the module 200. Surface tension may cause the moisture droplets 226 to adhere to the module 200 increasing the difficulty of drying. Additionally, moisture droplets 226 may become entrapped in the cavities 228 within the connector 224, or under components such as Quad Flat Packs (QFP's), Thin Small Outline Packages (TSOP's), Ball Grid Arrays (BGA's), Micro Ball Grid Arrays (uBGA's) and the like, further increasing the difficulty of drying, as forced air and infrared heating can not accelerate the evaporation of moisture within the cavities 228.

Figure 17:
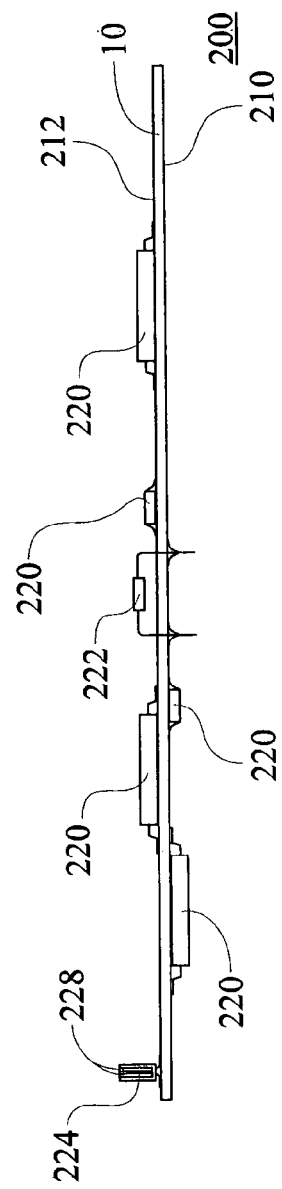
FIG. 17 is a sectional side elevation illustrating a module where the water droplets have been removed.

FIG. 17 illustrates a module 200 in the desirable state, which has been through the drying process. All of the moisture droplets 226 which were previously shown in FIG. 16 have been removed by the drying process. Additionally, moisture droplets 226 entrapped in the connector 224 and under components have also been removed.

Figure 18:
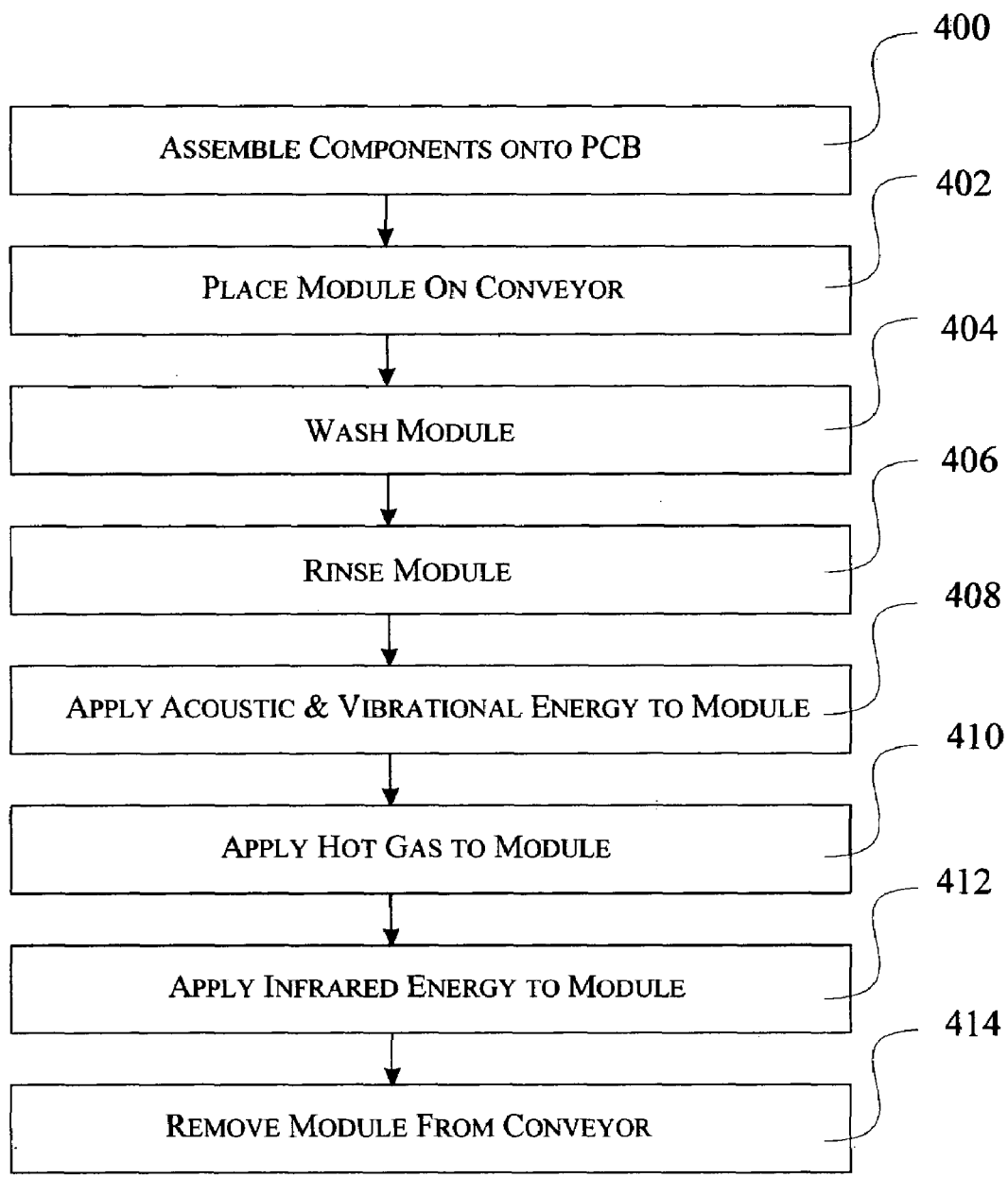
FIG. 18 is a flow diagram which illustrates the general assembly and cleaning process in conjunction with the present invention.

FIG. 18 is a flowchart which illustrates the assembly and drying process. The process begins with the first step 400 where surface mount components 220 and leaded components 222 are assembled onto a Printed Circuit Board 10. This can be accomplished using any of the known technology. During the second step 402, the module 200 is placed on a conveyor (not shown) of an automated cleaning apparatus (not shown). During the third step 404, the module 200 is washed. During the fourth step 406 the module 200 is rinsed. During the fifth step 408, vibrational energy 42 in the form of pressure waves (shown in FIG. 19) is directed towards to the module 200. During the sixth step 410, hot gas 52 (shown in FIG. 19) can be applied to the module 200. During the seventh step 412, infrared energy (not shown) can applied to the module 200. It can be recognized that the sixth step 410 and the seventh step 412 can be used independently, or any other technology currently known to assist in drying a module 200. It can also be recognized that the use of vibrational energy 42 can be applied in simultaneously with any other known drying apparatuses. During the final step 414, the module 200 is removed from the conveyor of the automated cleaning apparatus (not shown).

Figure 19:
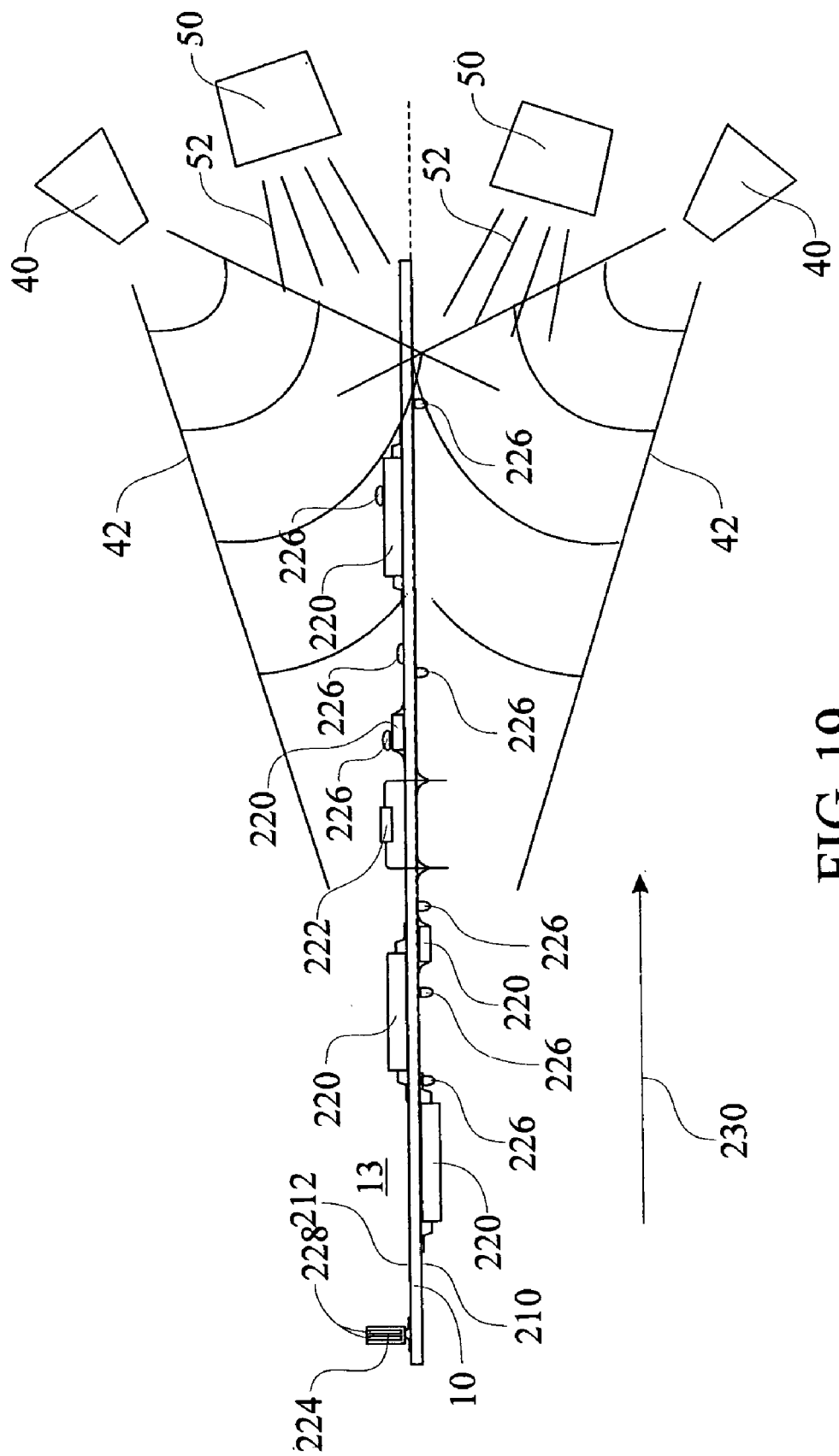
FIG. 19 is a sectional side elevation of a module being dried utilizing acoustic pressure waves and hot gas.

FIG. 19 illustrates a module 200 traveling on a path 230 from left to right, the path representative of a conveyor. The module 200 has moisture droplets 226 on the component side 212, the solder side 210 and entrapped in the connector 224. At least one transponder 40 emits vibrational energy 42 in the form of pressure wave which impinge the module 200 and the moisture droplets 226 at a predetermined angle. The vibrational energy 42 atomizes the moisture droplets 226 on the component side 212, on the solder side 210, in the cavities 228 of the connector 224, and under components 220, 222. By atomizing the moisture droplets 226, the process reduces the gathered volume per droplet and increases the surface area per droplet.

These two changes increase the rate of evaporation. A second drying means can be used to further dry the module 200. The figure illustrates a hot gas 52, preferably hot air, can be emitted from a hot air nozzle 50 which is directed at the module 200 in a predetermined angle. The hot air 54 evaporates the atomized moisture droplets 226 and removes them from the module 200. The module 200 may then be treated with infrared energy to complete the drying process. Other methods can include forced air using turbines, infrared heating, convection heating, and the like.

Inventors further define the present invention whereby other items can replace the Printed Circuit Board 10, the other items can be include Ball Grid Arrays, IC wafers, and the like. The technology can be further applied to other screening processes such as silk screening.

The Inventors recognize the application of a squeegee 102 can be replaced by a number of alternatives, one such example is the solder paste application apparatus described in Freeman, et al. (U.S. Pat. No. 5,947,022). Another alternative is to add vibrational energy to the squeegee 102 or other printable material 26 applicator.

Various changes may be made to the embodiment shown herein without departing from the spirit and scope of the present invention.

What is claimed is:

1. A method for cleaning at least one of electronic assembly, stencil, and tooling related to manufacture of electronic assemblies, the steps comprising:
    cleaning at least one of electronic assembly, stencil, and tooling related to manufacture of electronic assemblies by applying a fluid to said at least one of electronic assembly, stencil, and tooling related to manufacture of electronic assemblies via a fluid application apparatus,
    applying a drying step utilizing vibrational energy in accordance with at least one of:
        a) via a mechanical coupling a vibrational energy and said stencil by placing a material between a vibrational energy source and said stencil; and
        b) via applying vibrational energy through the air, directing said vibrational energy towards the at least one of electronic assembly, stencil, and tooling related to manufacture of electronic assemblies,
    wherein said vibrational energy is to aid in drying the at least one of electronic assemblies and tooling related to manufacture of electronic assemblies by applying vibrational energy to a section of said at least one of electronic assembly, stencil, and tooling related to manufacture of electronic assemblies via a vibrational energy application apparatus, wherein said vibrational energy application apparatus applies said vibrational energy after said fluid cleaning step, where said vibrational energy is applied for atomizing residual moisture droplets resident to the at least one of electronic assemblies and tooling related to manufacture of electronic assemblies.

2. The method of claim 1, the method further comprising the step of:
    applying vibrational energy to aid in cleaning of at least one of electronic assemblies and tooling related to manufacture of electronic assemblies.

3. The method of claim 2, the method further comprising transferring the relational proximity of the vibrational energy source and the at least one of electronic assembly, stencil, and tooling related to manufacture of electronic assemblies to one another.

4. The method of claim 1, the method further comprising transferring the relational proximity of the vibrational energy source and the at least one of electronic assembly, stencil, and tooling related to manufacture of electronic assemblies to one another.

5. The method of claim 1, wherein the step of applying vibrational energy by transferring the vibrational energy for drying is accomplished by:
    applying vibrational energy through the air, wherein said vibrational energy is directed towards the at least one of electronic assembly, stencil, and tooling related to manufacture of electronic assemblies.

6. A method for cleaning a solder stencil, the method comprising the steps:
    applying a fluid to a section of a solder stencil for cleaning said solder stencil for a fluid cleaning process,
    applying vibrational energy by at least one of mechanically coupling a vibrational energy source and the solder stencil and transferring the vibrational energy through the air directed towards the solder stencil,
    moving said vibrational energy source respective to said solder stencil, and
    applying said vibrational energy to apply a vibrational energy to said solder stencil, wherein said vibrational energy application apparatus applies said vibrational energy after the fluid cleaning process, where said vibrational energy is applied to assist in drying any residual fluid from said solder stencil by atomizing said residual fluid away from a top surface of said solder stencil.

7. The method of claim 6, the method further comprising the step:
    transferring the relational proximity of the vibrational energy source and the solder stencil to one another.

8. The method of claim 7, the method further comprising the step:
    applying vibrational energy to the fluid to assist in a cleaning process.

9. The method of claim 6, the method further comprising the step:

applying vibrational energy to the fluid to assist in a cleaning process.

10. The method of claim 9, the method further comprising the steps commonly associated with automated solder screen printing, the commonly associated steps of solder screen printing comprising aligning electronic pads of a printed circuit board and apertures of the solder stencil, passing solder paste across apertures of a stencil, and separating the printed circuit board and the solder stencil.

11. The method of claim 6, the method further comprising the steps commonly associated with automated solder screen printing, the commonly associated steps of solder screen printing comprising aligning electronic pads of a printed circuit board and apertures of the solder stencil, passing solder paste across apertures of a stencil, and separating the printed circuit board and the solder stencil.

12. The method of claim 6, the method further comprising the step:

wiping the stencil with the wiping material.

13. The method of claim 12, method further comprising the step:

applying a vacuum force to aid in cleaning the stencil, wherein said vacuum force applies a vacuum force from underneath and proximate the stencil.

14. The method of claim 6, the method further comprising the step:

applying a vacuum force to aid in cleaning the stencil.

15. A method for cleaning and drying a stencil, the method comprising the steps:

aligning at least one of: a printed circuit board to the stencil and an Integrated Circuit (IC) Wafer to the stencil, the stencil comprising at least one aperture, positioning the printed circuit board proximate the stencil;

passing a printable medium across the at least one aperture of the stencil to apply a pattern of printable medium onto at least one of the printed circuit board and the IC wafer, applying a fluid based cleaning process to at least one of the stencil and a wiping material; and applying vibrational energy by at least one of:

through the air, via mechanical contact to the stencil, and to the wiping material, wherein said vibrational energy is applied towards said solder stencil, wherein said vibrational energy application apparatus applies said vibrational energy after said fluid cleaning process, where said vibrational energy is applied to aid in drying the stencil wherein said vibrational energy for drying is applied in a manner to evaporate the material via the top of said stencil.

16. The method of claim 15, the method further comprising the step:

applying the vibrational energy to aid in cleaning the stencil.

17. The method of claim 15, the method further comprising the step:

wiping the stencil with the wiping material.

18. The method of claim 16, the method further comprising the step:

applying a vacuum force to aid in cleaning the stencil, wherein said vacuum force applies a vacuum force from underneath and proximate the stencil.

19. The method of claim 16, the method further comprising the step:

solidifying said printable medium applied onto the IC wafer.

20. The method of claim 16, the method further comprising the step:

applying vibrational energy to assist in releasing the printable medium from said stencil.

* * * * *